United States Patent
Zhu et al.

(10) Patent No.: US 10,629,283 B2
(45) Date of Patent: Apr. 21, 2020

(54) DISPLAY PANEL AND DISPLAY DEVICE

(71) Applicant: WUHAN TIANMA MICRO-ELECTRONICS CO., LTD., Wuhan (CN)

(72) Inventors: Jiazhu Zhu, Wuhan (CN); Shanfu Yuan, Shanghai (CN); Tao Peng, Wuhan (CN); Ruiyuan Zhou, Xiamen (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/167,870

(22) Filed: Oct. 23, 2018

(65) Prior Publication Data

US 2019/0392915 A1 Dec. 26, 2019

(30) Foreign Application Priority Data

Jun. 25, 2018 (CN) .......................... 2018 1 0662409

(51) Int. Cl.
*G09G 3/3266* (2016.01)
*G11C 19/28* (2006.01)
(Continued)

(52) U.S. Cl.
CPC ............. *G11C 19/287* (2013.01); *G09G 3/20* (2013.01); *G09G 3/3266* (2013.01);
(Continued)

(58) Field of Classification Search
CPC ...... G09G 3/20; G09G 3/3266; G09G 3/3674; G09G 2300/0408; G09G 2310/02; G09G 2310/0205; G09G 2310/0218; G09G 2310/0286; G09G 2310/08
See application file for complete search history.

(56) References Cited

U.S. PATENT DOCUMENTS

| | | | | | |
|---|---|---|---|---|---|
| 2001/0013852 | A1* | 8/2001 | Matsushima | ........ | G09G 3/3614 345/92 |
| 2001/0045925 | A1* | 11/2001 | Libsch | ................. | G09G 3/3659 345/87 |

(Continued)

FOREIGN PATENT DOCUMENTS

KR 101244559 B1 3/2013

*Primary Examiner* — Michael J Eurice
(74) *Attorney, Agent, or Firm* — Anova Law Group PLLC

(57) ABSTRACT

Display panel and display device are provided. The display panel includes scan lines and a scan driving circuit including shift registers in a cascaded configuration and multiplexers. One shift register is connected to one multiplexer. One multiplexer is connected to M scan lines and includes M control units connected with the scan lines in a one-to-one correspondence. Output terminals of switch branches in a control unit are connected to one scan line. An input terminal of a main switch branch is connected to an output terminal of the shift register. An input terminal of an auxiliary switch branch is connected to a first signal line. In one scanning period, in M consecutive time stages, a signal from each shift register to the multiplexer includes effective voltage levels; the main switch branches in the control units are switched on sequentially, and output the scanning signal to the M scan lines sequentially.

11 Claims, 19 Drawing Sheets

(51) Int. Cl.
*G09G 3/20* (2006.01)
*G09G 3/36* (2006.01)

(52) U.S. Cl.
CPC ... *G09G 3/3674* (2013.01); *G09G 2300/0408* (2013.01); *G09G 2300/0426* (2013.01); *G09G 2310/02* (2013.01); *G09G 2310/0205* (2013.01); *G09G 2310/0218* (2013.01); *G09G 2310/0286* (2013.01); *G09G 2310/08* (2013.01)

(56) References Cited

U.S. PATENT DOCUMENTS

| | | | |
|---|---|---|---|
| 2004/0066361 A1 | 4/2004 | Ishii et al. | |
| 2005/0007352 A1* | 1/2005 | Nathan | G09G 3/3677 345/204 |
| 2005/0122827 A1* | 6/2005 | Wang | G09G 3/3677 365/232 |
| 2006/0146112 A1 | 7/2006 | Kim et al. | |
| 2009/0146920 A1* | 6/2009 | Miyake | G09G 3/3677 345/55 |
| 2014/0300399 A1* | 10/2014 | Miyake | G09G 3/3677 327/296 |
| 2014/0340381 A1* | 11/2014 | Kim | G09G 3/3655 345/212 |
| 2015/0243203 A1* | 8/2015 | Kim | G09G 3/3233 345/212 |
| 2016/0379546 A1* | 12/2016 | Kim | G09G 3/2092 345/213 |
| 2017/0287390 A1* | 10/2017 | Lee | G09G 3/3233 |
| 2019/0172399 A1* | 6/2019 | Chen | G09G 3/3688 |

* cited by examiner

DISPLAY PANEL AND DISPLAY DEVICE

CROSS-REFERENCES TO RELATED APPLICATION

This application claims the priority of Chinese Patent Application No. 201810662409.8, filed on Jun. 25, 2018, the content of which is incorporated herein by reference in its entirety.

TECHNICAL FIELD

The present disclosure generally relates to the field of display technology and, more particularly, relates to a display panel and a display device.

BACKGROUND

A liquid crystal display panel and an organic light-emitting display panel are often used in current display devices. In a liquid crystal display panel, a voltage is applied between a pixel electrode and a common electrode, to form an electric field which can control a rotation of liquid crystal molecules. Subsequently, a transmission of lights can be controlled to realize a display function in the display panel. An organic light-emitting display panel uses an organic electroluminescent material. When an electric current passes through the organic electroluminescent material, the luminescent material will emit a light to realize a display function in the display panel.

With applications of the display technologies in smart wearable devices and other portable electronic devices, a design of the electronic products constantly pursues a user's smooth experience. At the same time, the electronic products also constantly pursue the user's sensory experience. Performances in a wide viewing angle, a high resolution, a narrow frame, and high screen ratio, become selling points of the electronic products.

Correspondingly, there is a need to provide a display panel and a display device with a narrower frame and a larger screen ratio. The disclosed display panel and display device are directed to solve the one or more problems set forth above and other problems.

SUMMARY

One aspect of the present disclosure provides a display panel. The display panel includes: a plurality of scan lines; and a scan driving circuit, configured to drive the scan lines. The plurality of scan lines extend along a first direction and are arranged sequentially along a second direction. The first direction and the second direction intersect each other. The scan driving circuit includes shift registers in a cascaded configuration and multiplexers. One shift register is electrically connected to one multiplexer. The one multiplexer is electrically connected to M scan lines arranged sequentially along the second direction, where M is a positive integer and $M \geq 2$. The shift registers have output terminals and input terminals, and include a first level shift register, a second level shift register, until an N-th level shift register, where N is a positive integer and $N \geq 2$. An input terminal of the first level shift register receives an initial shift signal of the display panel. An input terminal of each level shift register, from the second-level shift register to the N-th-level shift register, is electrically connected to an output terminal of a previous-level shift register. The one multiplexer includes M control units that are electrically connected to the M scan lines in a one-to-one correspondence. The control unit includes switch branches, and output terminals of all switch branches in a same control unit are electrically connected to one same scan line. The switch branches in the same control unit include a main switch branch and at least one auxiliary switch branch. An input terminal of the main switch branch is electrically connected to an output terminal of a corresponding shift register, and an input terminal of the auxiliary switch branch is electrically connected to a first signal line. In one scanning period, the initial shift signal includes an effective voltage level in M consecutive time stages and a signal outputted by each level shift register to a corresponding multiplexer includes the effective voltage level in the M consecutive time stages; and in the M consecutive time stages, the main switch branches in the control units of the corresponding multiplexer are sequentially switched on, and sequentially output the scanning signal to the M scan lines.

Another aspect of the present disclosure provides a display device. The display device includes a display panel provided by the present disclosure. The display panel includes a plurality of scan lines; and a scan driving circuit, configured to drive the scan lines. The plurality of scan lines extend along a first direction and are arranged sequentially along a second direction. The first direction and the second direction intersect each other. The scan driving circuit includes shift registers in a cascaded configuration and multiplexers. One shift register is electrically connected to one multiplexer. The one multiplexer is electrically connected to M scan lines arranged sequentially along the second direction, where M is a positive integer and $M \geq 2$. The shift registers have output terminals and input terminals, and include a first level shift register, a second level shift register, until an N-th level shift register, where N is a positive integer and $N \geq 2$. An input terminal of the first level shift register receives an initial shift signal of the display panel. An input terminal of each level shift register, from the second-level shift register to the N-th-level shift register, is electrically connected to an output terminal of a previous-level shift register. The one multiplexer includes M control units that are electrically connected to the M scan lines in a one-to-one correspondence. The control unit includes switch branches, and output terminals of all switch branches in a same control unit are electrically connected to one same scan line. The switch branches in the same control unit include a main switch branch and at least one auxiliary switch branch. An input terminal of the main switch branch is electrically connected to an output terminal of a corresponding shift register, and an input terminal of the auxiliary switch branch is electrically connected to a first signal line. In one scanning period, the initial shift signal includes an effective voltage level in M consecutive time stages and a signal outputted by each level shift register to a corresponding multiplexer includes the effective voltage level in the M consecutive time stages; and in the M consecutive time stages, the main switch branches in the control units of the corresponding multiplexer are sequentially switched on, and sequentially output the scanning signal to the M scan lines.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
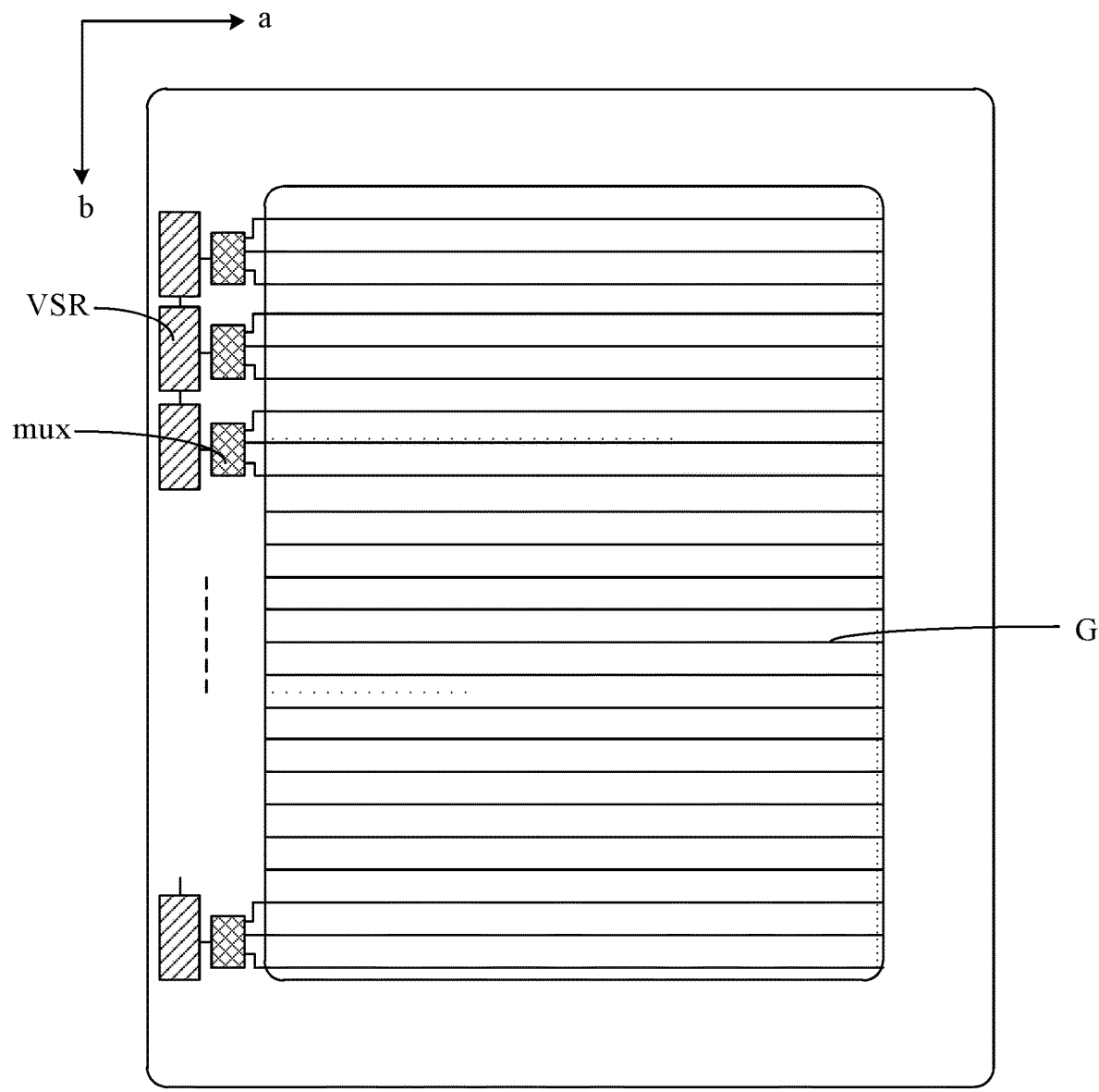
FIG. 1 illustrates a structure of an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides those schematic diagrams are merely examples, and not intended to limit the scope of the invention. Furthermore, a three-dimensional (3D) size including length, width and depth should be considered during practical fabrication.

Figure 2:
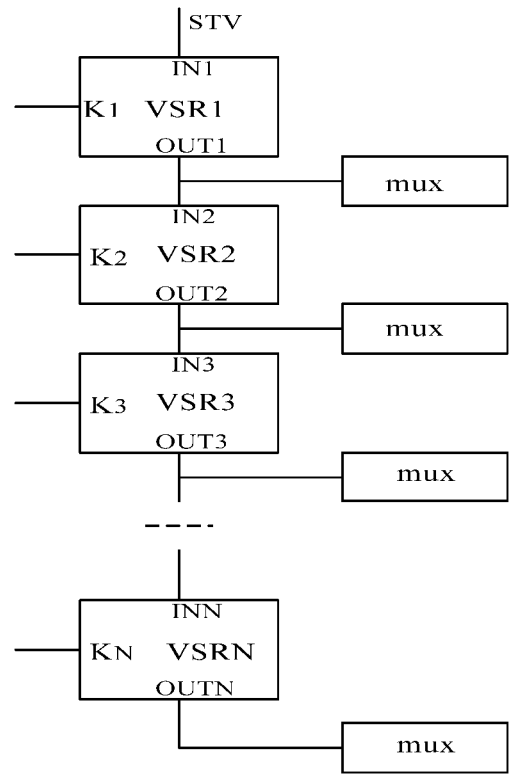
FIG. 2 illustrates a structure of cascaded shift registers in an exemplary display panel consistent with various disclosed embodiments in the present disclosure.
Figure 3:
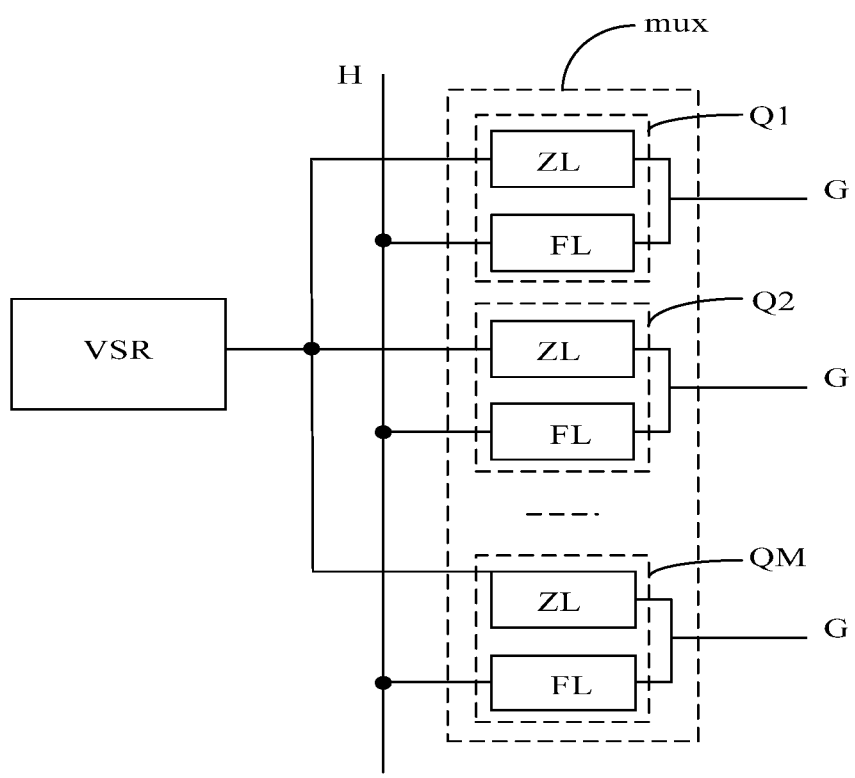
FIG. 3 illustrates a structure of a multiplexer in an exemplary display panel consistent with various disclosed embodiments in the present disclosure.
Figure 4:
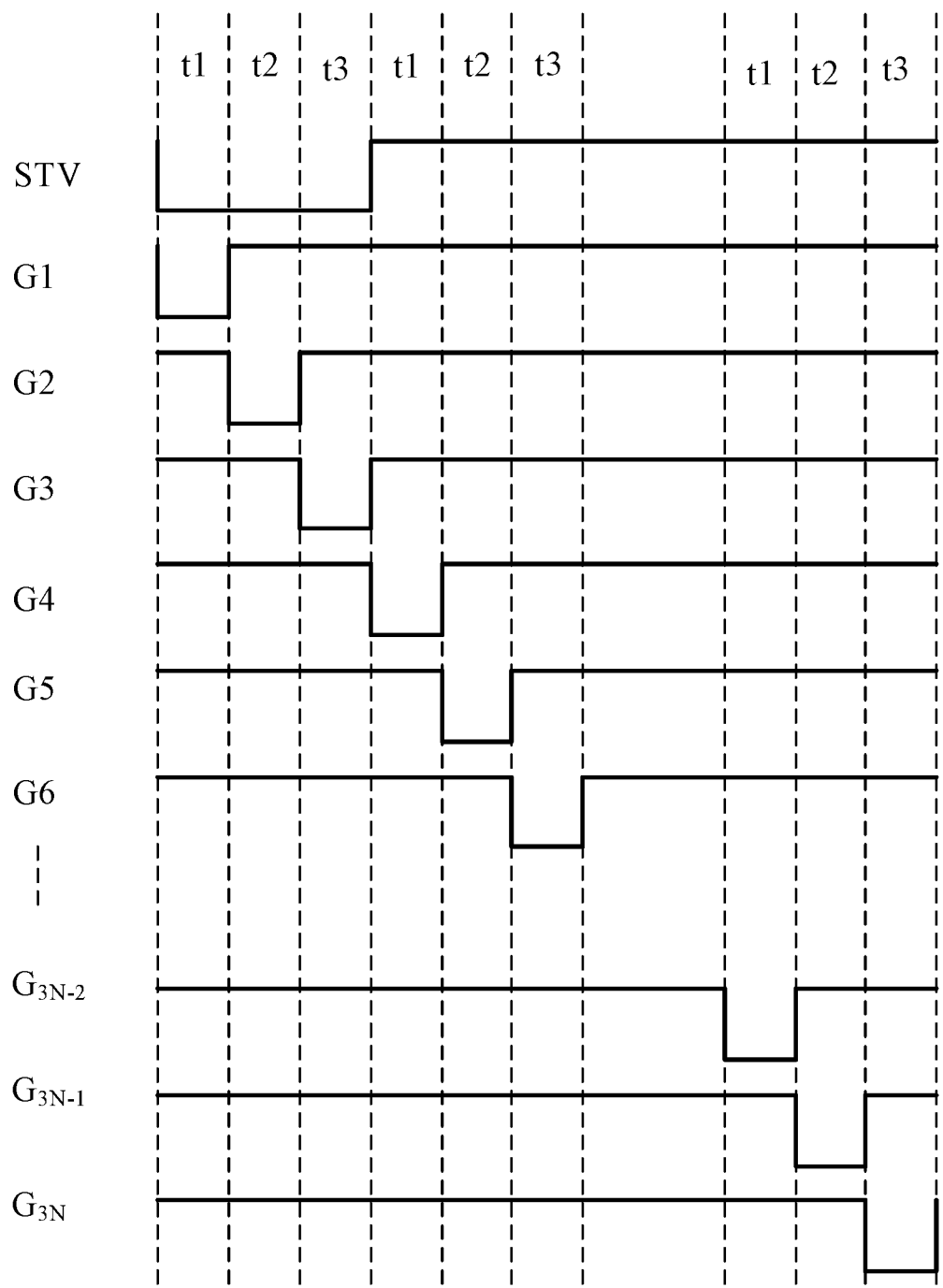
FIG. 4 illustrates a time sequence diagram of an exemplary display panel consistent with various disclosed embodiments in the present disclosure.

FIG. 1 illustrates a structure of an exemplary display panel consistent with various disclosed embodiments in the present disclosure; FIG. 2 illustrates an exemplary structure of cascaded shift registers in a display panel consistent with various disclosed embodiments in the present disclosure; FIG. 3 illustrates a structure of an exemplary multiplexer in a display panel consistent with various disclosed embodiments in the present disclosure, and FIG. 4 illustrates an exemplary time sequence diagram for a display panel consistent with various disclosed embodiments in the present disclosure.

Referring to FIG. 1, the display panel may include: a plurality of scan lines G and a scan driving circuit to drive the scan lines. The plurality of scan lines G may extend along a first direction a and may be arranged sequentially along a second direction b. The first direction a and the second direction b may intersect each other. The scan driving circuit may include shift registers VSR and multiplexers mux. The shift registers VSR may be in a cascaded configuration and each shift register may be connected to a multiplex. Each multiplexer mux may be electrically connected to M scan lines which are arranged along the second direction b sequentially. M may be a positive integer and M≥2. For illustration purposes, FIG. 1 illustrates an exemplary display panel where each multiplex is electrically connected to three scan lines as an example, although any number, more or less than three, of scan lines may be included in the disclosed display panel according to various embodiments of the present disclosure.

As illustrated in FIG. 2, each shift register VSR may include an input terminal IN and an output terminal OUT. The shift registers may include a first level shift register, a second level shift register, until an N-level shift register. An input terminal IN1 of the first-level shift register VSR1 may receive an initial shift signal STV of the display panel. An input terminal IN of each level shift register between the second-level shift register VSR2 and the N-th-level shift register VSRN may be electrically connected to an output terminal of a previous-level shift register VSR. N may be a positive integer and N≥2. Each shift register VSR may further include a control terminal K. The control terminal K may receive a control signal for the shift register. The output terminal of each shift register VSR may be connected to a multiplexer mux.

As illustrated in FIG. 3, each multiplexer mux may include M control units Q, i.e., a first control unit Q1, a second control unit Q2, . . . , and an M-th control unit QM. The control units Q may be electrically connected to the M scan lines G in a one-to-one correspondence. A number of the control units Q may be as same as a number of the scan lines G controlled by a multiplexer mux. Each control unit Q may include switch branches L, and all output terminals of the switch branches in a same control unit Q may be connected to a same scan line G. The switch branches L in a control unit Q may include a main switch branch ZL and at least one auxiliary switch branch FL. An input terminal of the main switch branch ZL may be electrically connected to the output terminal of the corresponding shift register VSR, and an input terminal of the auxiliary switch branch FL may be electrically connected to a first signal line H. When the main switch branch ZL is switched on, the corresponding shift register can output an effective voltage level signal to the corresponding scan lines G. When the auxiliary switch branch FL is switched on, the first signal line H can output signals to the corresponding scan lines.

In one scanning period, the initial shift signal STV may include an effective voltage level in consecutive M time stages. A signal outputted by each shift register VSR to the corresponding multiplexer may include the effective voltage level of consecutive M time stages. In the consecutive M time stages, the main switch branch ZL in the control units Q of the corresponding multiplexer mux may be switched on sequentially and may sequentially output scanning signals to the corresponding M scan lines. Correspondingly, one shift register VSR could output scanning signals to M scan lines sequentially in the consecutive M time stages. The one scanning period may be a display time when the display panel displays one frame of images. All scan lines in the display panel may receive scanning signals in one scanning period.

For illustration purposes only, FIG. 4 illustrates an exemplary time sequence diagram for a display panel consistent with various disclosed embodiments in the present disclosure with M=3 as an example, although any number, more or less than three, of M may be included in the disclosed display panel according to various embodiments of the present disclosure. The initial shift signal STV may include the effective voltage level in three consecutive time stages. Each multiplexer mux may be electrically connected to three scan lines G arranged along the second direction sequentially. When the first-level shift register VSR1 receives the initial shift signal STV, the first-level shift register VSR1 may output the effective voltage level in three consecutive time stages to the multiplexer mux connected to the first-level shift register. In the first time stage t1, the main switch branch ZL in the first control unit Q1 of the multiplexer mux may be switched on, and the scanning signal may be outputted to the first scan line $G_1$ connected to the first control unit Q1; in the second time stage t2, the main switch branch ZL in the second control unit Q2 of the multiplexer mux may be switched on, and the scanning signal may be outputted to the second scan line $G_2$ connected to the second control unit Q2; in the third time stage t3, the main switch branch ZL in the third control unit Q3 of the multiplexer mux may be switched on, and the scanning signal may be outputted to the third scan line $G_3$ connected to the third control unit Q3. When the second-level shift register VSR2 receives the effective voltage level in three consecutive time stages from the first-level shift register VSR1, the second-level shift register VSR2 may output the effective voltage level in three consecutive time stages to the multiplexer mux connected to the second-level shift register. In the first time stage t1, the main switch branch ZL in the first control unit Q1 of the corresponding multiplexer mux may be switched on, and the scanning signal may be outputted to the fourth scan line $G_4$ connected to the first control unit Q1; in the second time stage t2, the main switch branch ZL in the second control unit Q2 of the multiplexer mux may be switched on, and the scanning signal may be outputted to the fifth scan line $G_5$ connected to the second control unit Q2; in the third time stage t3, the main switch branch ZL in the third control unit Q3 of the multiplexer mux may be switched on, and the scanning signal may be outputted to the sixth scan line $G_6$ connected to the third control unit Q3. Similarly, the cascaded shift registers may output scanning signals to the multiplexers connected to the shift registers sequentially. When the N-th-level shift register VSRN receives the effective voltage level in three consecutive time stages from the (N−1)-th-level shift register VSR N−1, the N-th-level shift register VSRN may output the effective voltage level in three consecutive time stages to the multiplexer mux connected to the N-th-level shift register. In the first time stage t1, the main switch branch ZL in the first control unit Q1 of the corresponding multiplexer mux may be switched on, and the scanning signal may be outputted to the (3N−2)-th scan line $G_{3N-2}$ connected to the first control unit Q1; in the second time stage t2, the main switch branch ZL in the second control unit Q2 of the multiplexer mux may be switched on, and the scanning signal may be outputted to the (3N−1)-th scan line $G_{3N-1}$ connected to the second control unit Q2; in the third time stage t3, the main switch branch ZL in the third control unit Q3 of the multiplexer mux may be switched on, and the scanning signal may be outputted to the (3N)-th scan line $G_{3N}$ connected to the third control unit Q3.

In the display panel consistent with various embodiments of the current disclosure, the multiplexers may be deployed in the scan driving circuit. Each shift register may be connected to a multiplexer and each multiplexer may be connected to M scan lines arranged along the second direction sequentially. Each multiplex may include M control units and the control units are electrically connected to the scan lines one by one. A number of the control units may be as same as a number of the scan lines connected to a multiplexer. Output terminals of switch branches in one control units may be connected to a same scan line and each control unit may control one scan line. The switch branches in one control unit may include a main switch branch and at least one auxiliary switch branch. An input terminal of the main switch branch may be connected to the output terminal of the corresponding shift register, and an input terminal of the auxiliary switch branch may be connected to the first signal line. In one scanning period, signals which the shift register at each level output to the corresponding multiplexer may include the effective voltage level in M consecutive time stages. In the M consecutive time stages, the main switch branch in each control unit of the corresponding multiplexer may be switched on sequentially to output scanning signals to the M scan lines sequentially. Correspondingly, one shift register may control the M scan lines and a number of the shift registers deployed in a frame of the display panel may be reduced compared to the current display technology where each shift register only controls one scan line. A space for the scan driving circuit in the frame of the display panel may be reduced and a narrow frame may be realized to improve the screen ratio.

Figure 5:
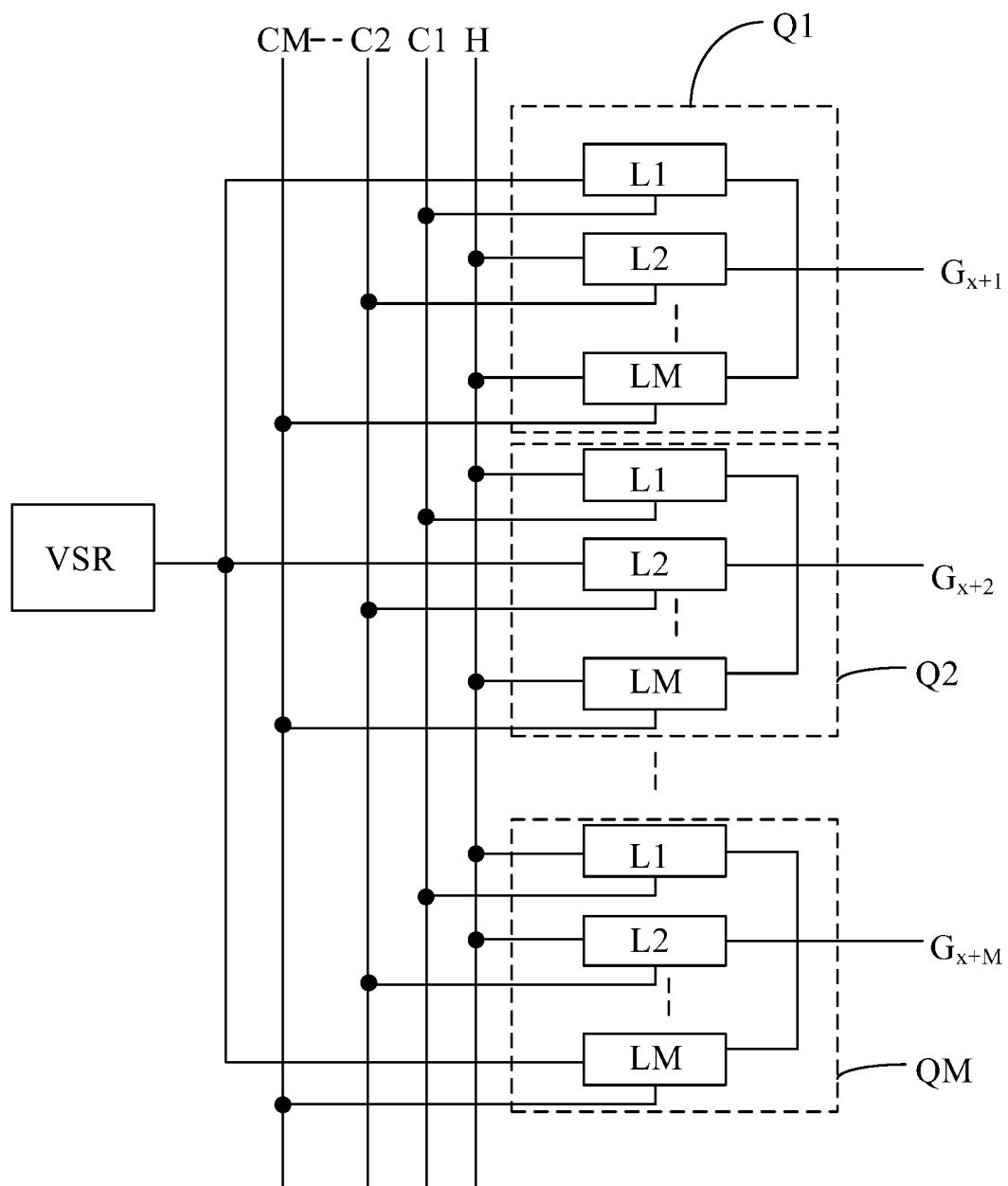
FIG. 5 illustrates a structure of another multiplexer for an exemplary display panel consistent with various disclosed embodiments in the present disclosure.

FIG. 5 illustrates an exemplary structure of another multiplexer in a display panel consistent with various embodiments of the present disclosure. The display panel may include a first control line C1, a second control line C2, . . . , and an M-th control line, as well as a first signal line H. Each control unit Q may include M switch branches L, i.e., a first switch branch L1, a second switch branch L2, . . . , and an M-th switch branch sequentially. The switch branches in the control unit Q may include one main switch branch ZL and M−1 auxiliary switch branches FL. In each control unit Q, a control terminal of the m-th switch branch Lm may be connected to the m-th control line Cm, where m is a positive integer number and m≤M. For example: a control terminal of the first switch branch L1 may be connected to the first control line C1, a control terminal of the second switch branch L2 may be connected to the second control line C2, . . . , and a control terminal of the M-th switch branch LM may be connected to the M-th control line CM. In each multiplexer, the m-th switch branch of the m-th control unit may be used as the main switch branch of the m-th control unit. For example, the first switch branch L1 of the first control unit Q1 may be used as the main switch branch of the first control unit Q1, the second switch branch L2 of the second control unit Q2 may be used as the main switch branch of the second control unit Q2, . . . , and the M-th switch branch of the M-th control unit QM may be used as the main switch branch of the M-th control unit QM. In one control unit, the input terminals of all main switch branches may be connected to the output terminal of the corresponding shift register. Output terminals of the switch branches in the first control unit Q1 may be connected to the (x+1)-th scan line $G_{x+1}$; Output terminals of all switch branches in the second control unit Q2 may be connected to the (x+2)-th scan line $G_{x+2}$, . . . , and output terminals of all switch branches in the M-th control unit may be connected to the (x+M)-th scan line $G_{x+M}$, where x is zero or an integer multiple of M. When x is zero, the scan line $G_1$, the scan line $G_2$, . . . , and the scan line $G_M$, may be arranged sequentially and may be the scan lines of the first-level shift register. When x is M, the scan line $G_{M+1}$, the scan line $G_{M+2}$, . . . , and the scan line $G_{M+M}$, may be arranged sequentially and may be the scan lines of the second-level shift register, and so on.

In the display panel provided by the embodiment of the present disclosure, the multiplexers may be deployed in the scan driving circuit. Each shift register may be connected to a multiplexer and each multiplexer may be connected to M scan lines arranged along the second direction sequentially. Each multiplex may include M control units and the control units are electrically connected to the scan lines one by one. A number of the control units may be as same as a number of the scan lines connected to a multiplexer. The display panel may further include M control line and a first signal line. Each control unit may include M switch branches. Control terminals of the switch branches may be connected to the control lines. An input terminal of the main switch branch may be connected to the output terminal of the corresponding shift register, and input terminals of other switch branches may be connected to the first signal line. When the multiplexer receives the effective voltage in M consecutive time stages from the corresponding shift register, the multiplexer may switch on the main switch branch in each control unit sequentially and output scanning signals to the M scan lines sequentially. One shift register may drive M scan lines by combining the control lines, the first signal line, and the multiplexer. Correspondingly, a number of the shift registers deployed in a frame of the display panel may be reduced compared to the current display technology where each shift register only controls one scan line. A space for the scan driving circuit in the frame of the display panel may be reduced and a narrow frame may be realized to improve the screen ratio.

In one scanning period, the m-th control line may provide an m-th clock signal, and the first signal line may provide a first signal. One clock period of each clock signal may include M time stages. In one clock period, the m-th clock signal may be the effective voltage level only in the m-th time stage. In each multiplexer, the multiplexer may output the scanning signals to the scan line connected to the m-th control unit, in the m-th time stage.

Figure 6:
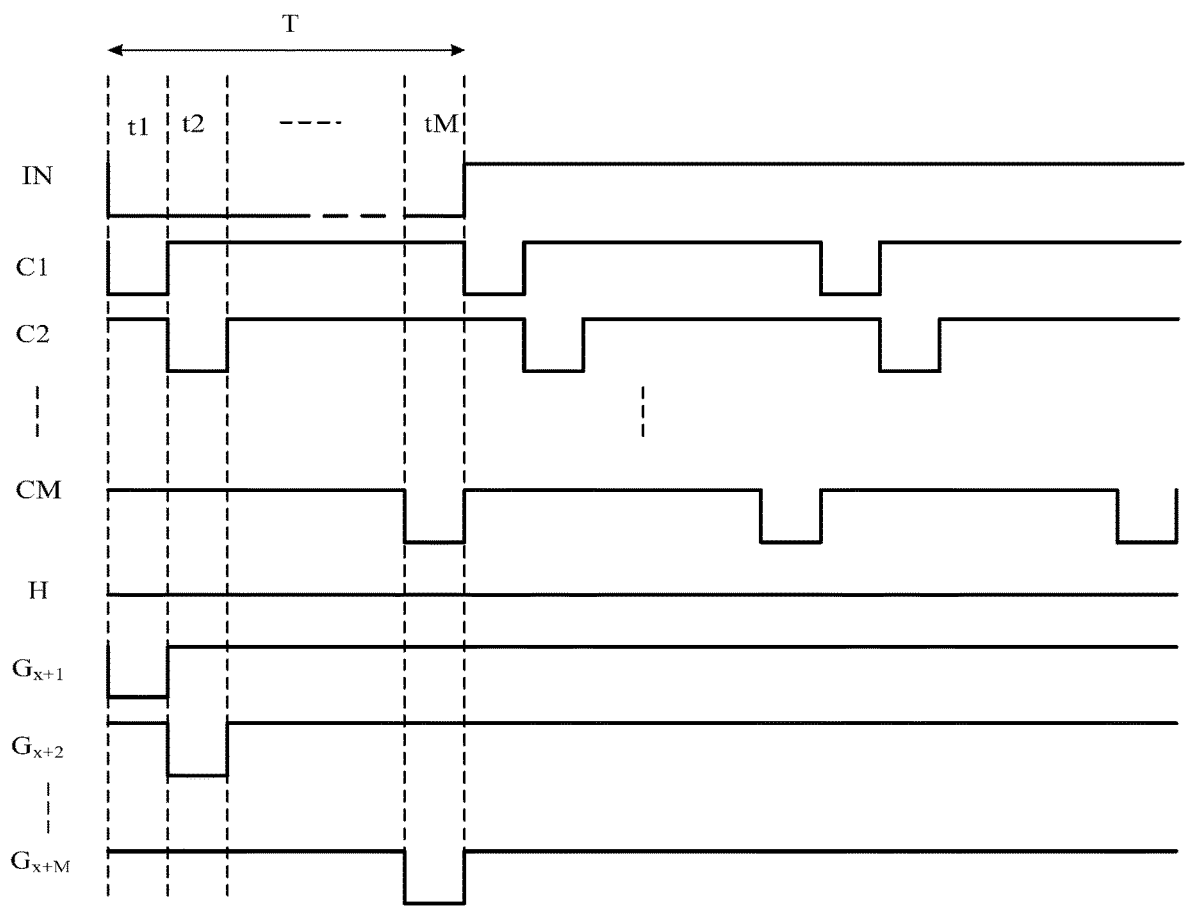
FIG. 6 illustrates a time sequence diagram of the multiplexer in FIG. 5 for a display panel consistent with various disclosed embodiments in the present disclosure.

FIG. 6 illustrates an exemplary time sequence diagram of the multiplexer in FIG. 5 for a display panel consistent with various disclosed embodiments in the present disclosure. The multiplexer may receive the effective voltage level IN in the M consecutive time stages from the corresponding shift register VSR. For example, the effective voltage level may be a low voltage signal to drive the scan lines, and the first signal from the first signal line H may be a high-voltage signal and cannot drive the scan lines.

In one clock period T, the first clock signal from the first control line C1 may only be an effective voltage level in the first time stage. In the first time stage t1, the first control line C1 may output a low-voltage signal and all other control lines may output high-voltage signals. The first switch branch L1 in each control unit Q may be switched on. When the first switch branch L1 in the first control unit Q1 is switched on, the corresponding shift register VSR may output the scanning signal to the (x+1)-th scan line $G_{x+1}$ through the first control unit Q. The first switch branches in all other control units may be auxiliary switch branches, and when the first switch branches in all other control units are switched on, the signal outputted to the scan lines connected to the corresponding switch branches may be the high voltage signal from the first signal line H. For example, in the first time stage t1 the multiplexer may output the scanning signal to the scan line connected to the first control unit Q1.

In one clock period T, the second clock signal from the second control line C2 may only be an effective voltage level in the second time stage. In the second time stage t2, the second control line C2 may output a low-voltage signal and all other control lines may output high-voltage signals. The second switch branch L2 in each control unit Q may be switched on. When the second switch branch L2 in the second control unit Q2 is switched on, the corresponding shift register VSR may output the scanning signal to the (x+2)-th scan line $G_{x+2}$ through the second control unit Q. The second switch branches in all other control units may be auxiliary switch branches, and when the second switch branches in all other control units are switched on, the signal outputted to the scan lines connected to the corresponding switch branches may be the high voltage signal from the second signal line H. For example, in the second time stage t2, the multiplexer may output the scanning signal to the scan line connected to the second control unit Q2.

In the same way, in one clock period T, the M-th clock signal from the M-th control line CM may only be an effective voltage in the M-th time stage. In the M-th time stage tM, the M-th control line CM may output a low-voltage signal and all other control lines may output high-voltage signals. The M-th switch branch LM in each control unit Q may be switched on. When the M-th switch branch LM in the M-th control unit QM is switched on, the corresponding shift register VSR may output the scanning signal to the (x+M)-th scan line $G_{x+M}$ through the M-th control unit Q. The M-th switch branches in all other control units may be auxiliary switch branches, and when the M-th switch branches in all other control units are switched on, the signal outputted to the scan lines connected to the corresponding switch branches may be the high voltage signal from the M-th signal line H. For example, in the M-th time stage tM, the multiplexer may output the scanning signal to the scan line connected to the M-th control unit QM.

Figure 7:
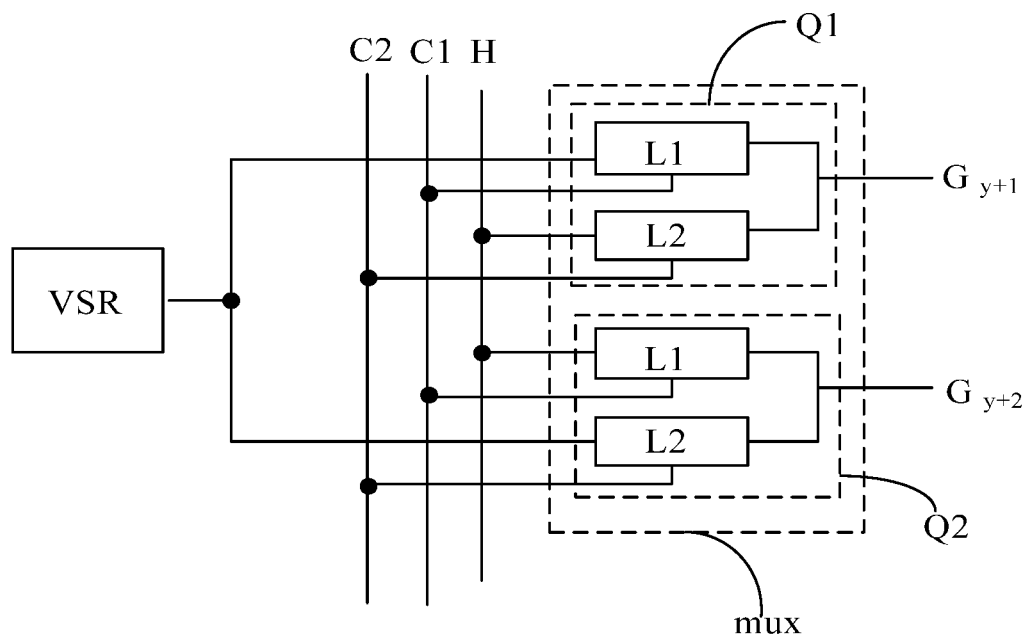
FIG. 7 illustrates a structure of another multiplexer for an exemplary display panel consistent with various disclosed embodiments in the present disclosure.

FIG. 7 illustrates a structure of another multiplexer in a display panel consistent with various embodiments of the present disclosure. In FIG. 7, M may be 2 and each multiplexer mux may include two control units Q. Each control unit may include two switch branches L. One switch branch may be used as the main switch branch and another switch branch may be used as the auxiliary switch branch.

In the first control unit Q1, the first switch branch L1 may be used as the main switch branch and the control terminal of the first switch branch L1 may be connected to the first control line C1. The input terminal of the first switch branch L1 may be connected to the output terminal of the corresponding shift register VSR. The control terminal of the second switch branch L2 may be connected to the second control line C2 and the input terminal of the second switch branch L2 may be connected to the first signal line H. The output terminals of both two switch branches may be connected to the same scan line $G_{y+1}$ where y is zero or an integer multiple of 2.

In the second control unit Q2, the control terminal of the first switch branch L1 may be connected to the first control line C1 and the input terminal of the first switch branch L1 may be connected to the first signal line H. The second switch branch L2 may be used as the main switch branch. The control terminal of the second switch branch L2 may be connected to the second control line C2 and the input terminal of the second switch branch L2 may be connected to the output terminal of the corresponding shift register VSR. The output terminals of both two switch branches may be connected to the same scan line $G_{y+2}$ where y is zero or an integer multiple of 2.

When y is zero, the scan line G1 and the scan line G2 may be arranged sequentially, and may be the scan lines driven by the first-level shift register VSR1. When y is 2, the scan line G3 and the scan line G4 may be arranged sequentially, and may be the scan lines driven by the second-level shift register VSR2, and so on.

Figure 8:
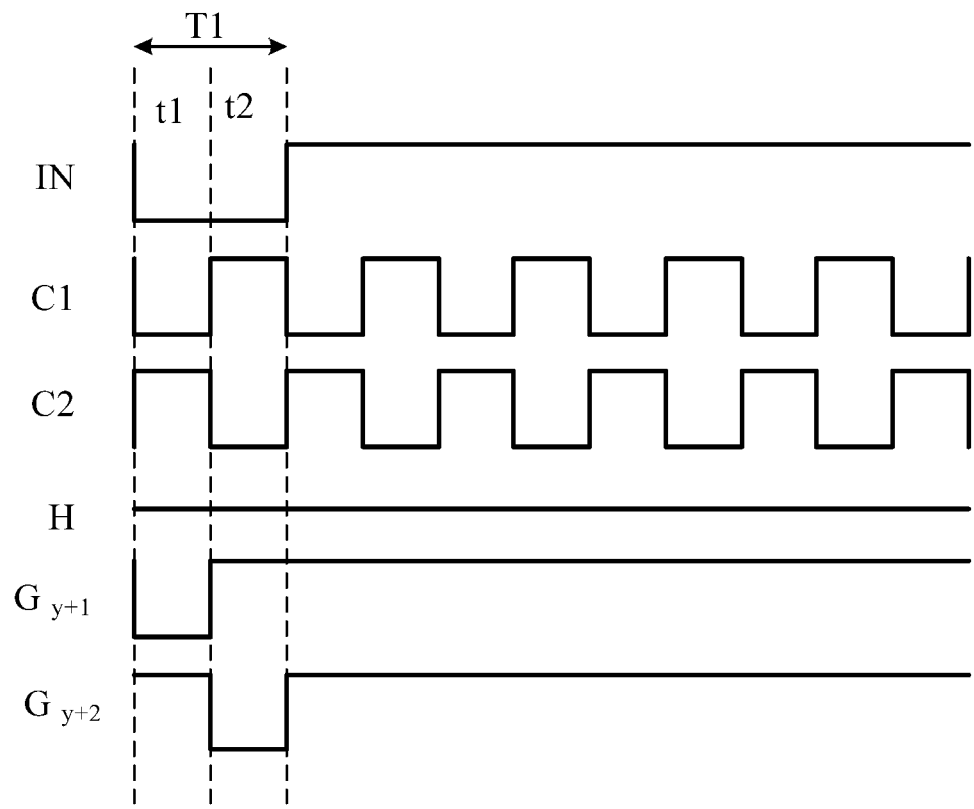
FIG. 8 illustrates a time sequence diagram of the multiplexer in FIG. 7 for a display panel consistent with various disclosed embodiments in the present disclosure.

FIG. 8 illustrates a time sequence diagram of the multiplexer in FIG. 7 for a display panel consistent with various disclosed embodiments in the present disclosure. The multiplexer may receive the effective voltage IN in two consecutive time stages from the corresponding shift register VSR. For example, the effective voltage may be a low voltage signal to drive the scan lines, and the first signal from the first signal line H may be a high-voltage signal and cannot drive the scan lines.

In one clock period T, the first clock signal from the first control line C1 may only be an effective voltage in the first time stage. In the first time stage t1, the first control line C1 may output a low-voltage signal to switch on the first switch branches L1 in two control units Q. When the first switch branch L1 in the first control unit Q1 is switched on, the corresponding shift register VSR may output the scanning signal to the (y+1)-th scan line $G_{y+1}$ through the first control unit Q1. The first switch branch L1 in the second control unit Q2 may be the auxiliary switch branch, and may output the high voltage signal provided by the first signal line H to the scan line $G_{y+2}$ when the first switch branch L1 in the second control unit Q2 is switched on.

In one clock period T, the second clock signal from the second control line C2 may only be an effective voltage in the second time stage. In the second time stage t2, the second control line C2 may output a low-voltage signal to switch on the second switch branches L2 in two control units Q. When the second switch branch L2 in the second control unit Q2 is switched on, the corresponding shift register VSR may output the scanning signal to the (y+2)-th scan line Gy+2 through the first control unit Q1. The second switch branch L2 in the first control unit 12 may be the auxiliary switch branch, and may output the high voltage signal provided by the first signal line H to the scan line $G_{y+1}$ when the second switch branch L2 in the first control unit Q1 is switched on.

In the display panel provided by the embodiment of the present disclosure, each multiplexer may be connected to two scan lines arranged along the second direction sequentially. By switching on or off four switch branches in two control units through the two control lines, the scanning signals may be outputted to two scan lines sequentially. Each shift register may drive two scan lines. Correspondingly, a number of the shift registers deployed in a frame of the display panel may be reduced by half compared to the current display technology where each shift register only controls one scan line. A space for the scan driving circuit in the frame of the display panel may be reduced and a narrow frame may be realized to improve the screen ratio.

Figure 9:
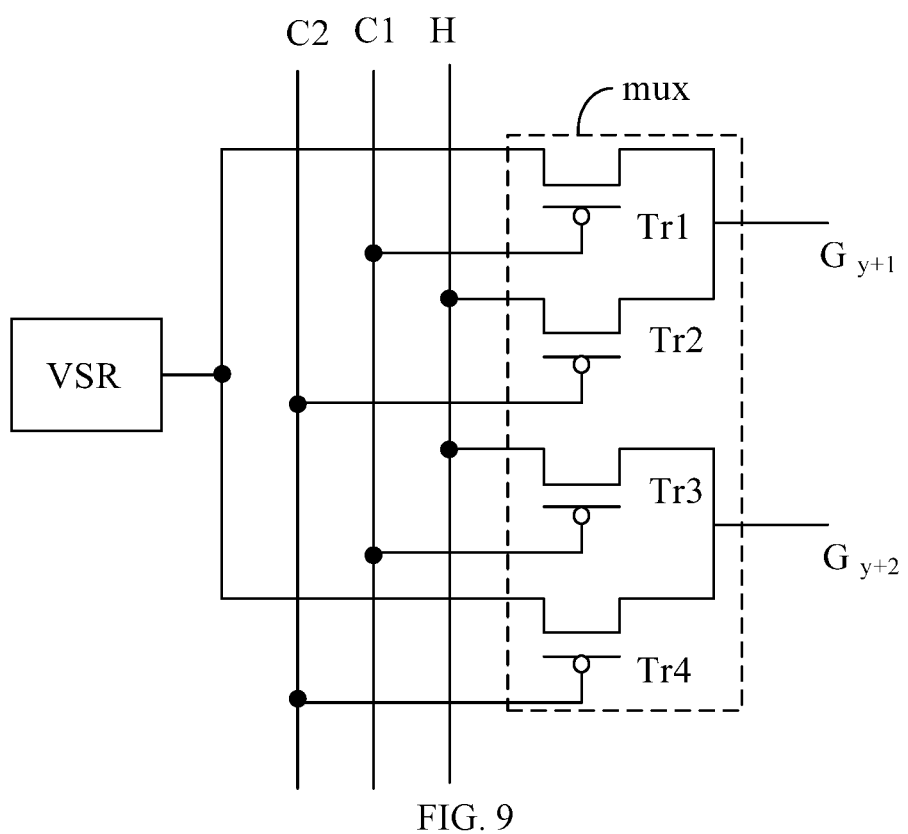
FIG. 9 illustrates a structure of another multiplexer for an exemplary display panel consistent with various disclosed embodiments in the present disclosure.

FIG. 9 illustrates a structure of another multiplexer in a display panel consistent with various embodiments of the present disclosure. Each multiplexer mux may include a first transistor Tr1, a second transistor Tr2, a third transistor Tr3, and a fourth transistor Tr4. A gate electrode of the first transistor Tr1 may be connected to the first control line C1, and a first electrode of the first transistor Tr1 may be connected to the output terminal of the corresponding shift register VSR. A gate electrode of the second transistor Tr2 may be connected to the second control line C2 and a first electrode of the second transistor Tr2 may be connected to the first signal line H. A gate electrode of the third transistor Tr3 may be connected to the first control line C1 and a first electrode of the third transistor Tr3 may be connected to the first signal line H. A gate electrode of the fourth transistor Tr4 may be connected to the second control line C2 and a first electrode of the fourth transistor Tr4 may be connected to the output terminal of the corresponding shift register VSR. A second electrode of the first transistor Tr1 and a second electrode of the second transistor Tr2 may be connected to a same scan line Gy+1. The second electrode of the third transistor Tr3 and a second electrode of the fourth transistor Tr4 may be connected to a same scan line Gy+2. A time sequential diagram of the multiplexer in the present embodiment may be referred to FIG. 8.

In the display panel provided by the embodiment of the present disclosure, each multiplexer may be connected to two scan lines arranged along the second direction sequentially, and each transistor may be used as a switch branch. By switching on or off four transistors in two control units through the two control lines, the scanning signals may be outputted to two scan lines sequentially. Each shift register may drive two scan lines. Correspondingly, a number of the shift registers deployed in a frame of the display panel may be reduced by half compared to the current display technology where each shift register only controls one scan line. A space for the scan driving circuit in the frame of the display panel may be reduced and a narrow frame may be realized to improve the screen ratio.

Figure 10:
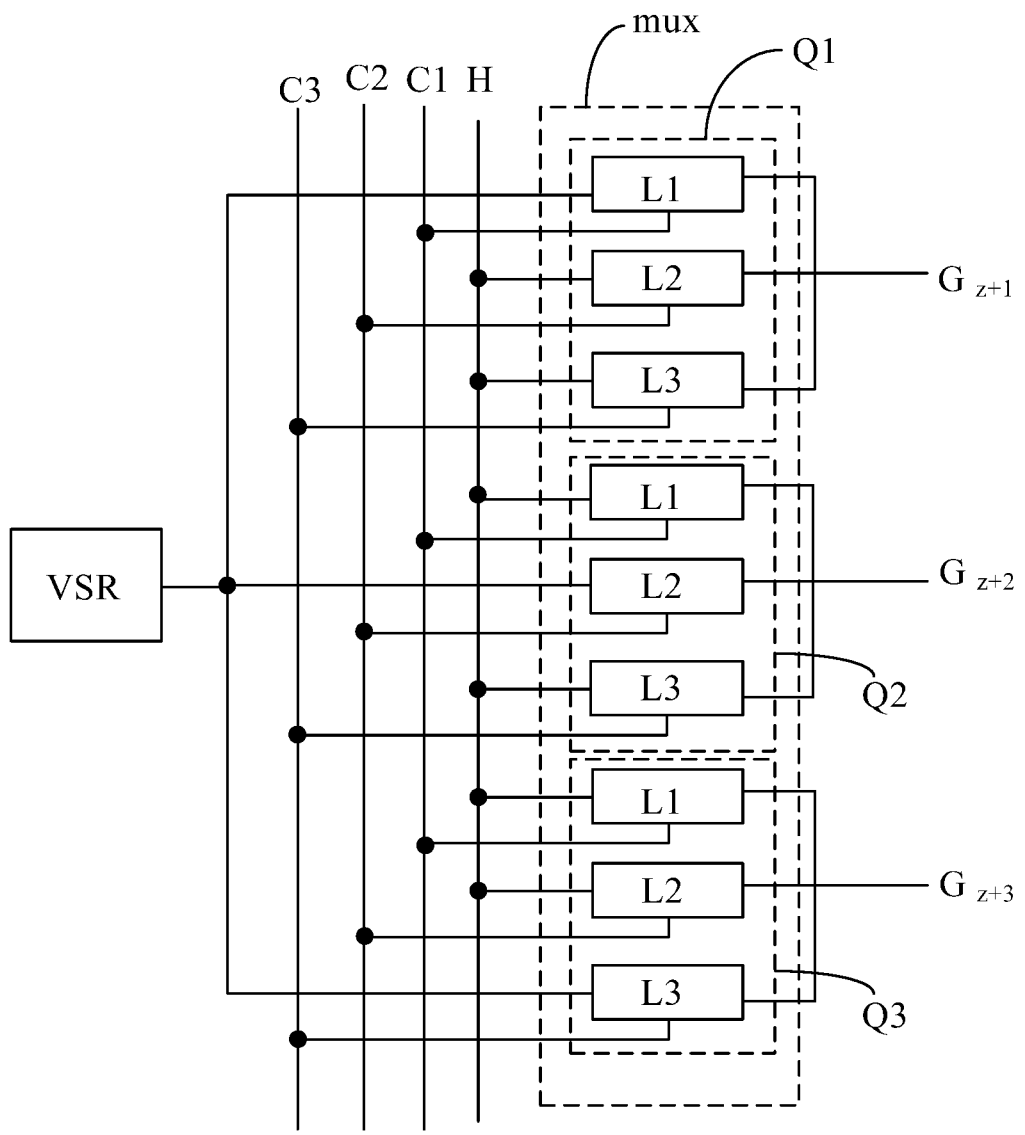
FIG. 10 illustrates a structure of another multiplexer for an exemplary display panel consistent with various disclosed embodiments in the present disclosure.

FIG. 10 illustrates a structure of another multiplexer in a display panel consistent with various embodiments of the present disclosure. In FIG. 7, M may be 3 and each multiplexer mux may include three control units Q. Each control unit may include three switch branches L. One switch branch may be used as the main switch branch and two other switch branches may be used as the auxiliary switch branches.

In the first control unit Q1, the first switch branch L1 may be used as the main switch branch and the control terminal of the first switch branch L1 may be connected to the first control line C1. The input terminal of the first switch branch L1 may be connected to the output terminal of the corresponding shift register VSR. The control terminal of the second switch branch L2 may be connected to the second control line C2 and the input terminal of the second switch branch L2 may be connected to the first signal line H. In the third switch branch L3, the control terminal may be connected to the third control line C3, and the input terminal may be connected to the first signal line H. The output terminals of all three switch branches L may be connected to a same scan line $G_{z+1}$.

In the second control unit Q2, the control terminal of the first switch branch L1 may be connected to the first control line C1 and the input terminal of the first switch branch L1 may be connected to the first signal line H. The second switch branch L2 may be used as the main switch branch. The control terminal of the second switch branch L2 may be connected to the second control line C2 and the input terminal of the second switch branch L2 may be connected to the output terminal of the corresponding shift register VSR. In the third switch branch L3, the control terminal may be connected to the third control line C3, and the input terminal may be connected to the first signal line H. The output terminals of all three switch branches L may be connected to a same scan line $G_{z+2}$.

In the third control unit Q3, the control terminal of the first switch branch L1 may be connected to the first control line C1 and the input terminal of the first switch branch L1 may be connected to the first signal line H. The control terminal of the second switch branch L2 may be connected to the second control line C2 and the input terminal of the second switch branch L2 may be connected to the first signal line H. The third switch branch L3 may be used as the main switch branch. In the third switch branch L3, the control terminal may be connected to the third control line C3 and the input terminal may be connected to the output terminal of the corresponding shift register VSR. The output terminals of all three switch branches L may be connected to a same scan line $G_{z+3}$.

In the present embodiment, z may be zero or an integer multiple of 3. When z is zero, the scan line G1, the scan line G2 and the scan line G3 may be arranged sequentially, and may be the scan lines driven by the first-level shift register VSR1. When z is 3, the scan line G4, the scan line G5 and the scan line G6 may be arranged sequentially, and may be the scan lines driven by the second-level shift register VSR2. And so on.

Figure 11:
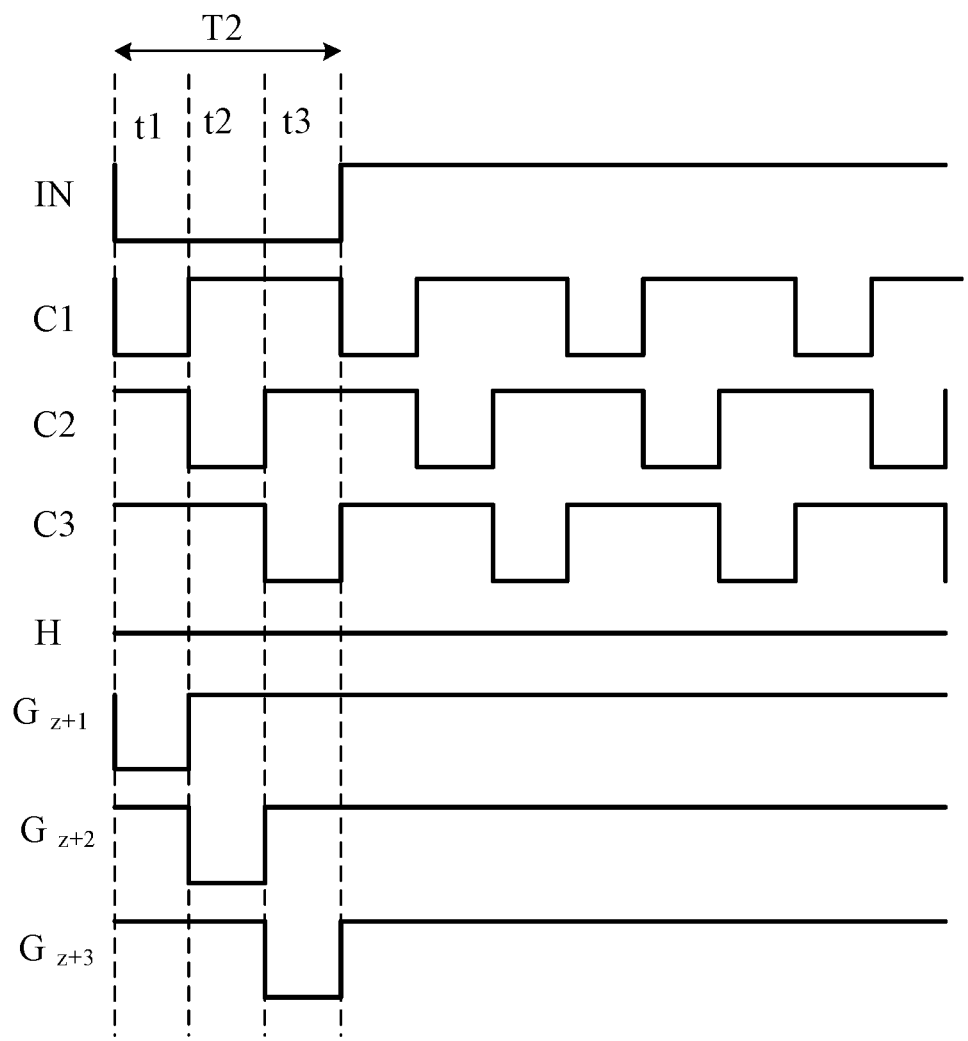
FIG. 11 illustrates a time sequence diagram of the multiplexer in FIG. 10 for a display panel consistent with various disclosed embodiments in the present disclosure.

FIG. 11 illustrates a time sequence diagram of the multiplexer in FIG. 10 or a display panel consistent with various disclosed embodiments in the present disclosure. The multiplexer may receive the effective voltage IN in three consecutive time stages from the corresponding shift register VSR. For example, the effective voltage may be a low voltage signal to drive the scan lines, and the first signal from the first signal line H may be a high-voltage signal and cannot drive the scan lines.

In one clock period T, the first clock signal from the first control line C1 may only be an effective voltage in the first time stage. In the first time stage t1, the first control line C1 may output a low-voltage signal to switch on the first switch branches L1 in two control units Q. When the first switch branch L1 in the first control unit Q1 is switched on, the corresponding shift register VSR may output the scanning signal to the (z+1)-th scan line Gz+1 through the first control unit Q1. The first switch branch L1 in the second control unit Q2 and the first switch branch L1 in the third control unit Q3 may be the auxiliary switch branch, and may output the high voltage signal provided by the first signal line H to the scan line $G_{z+2}$ and the scan line $G_{z+3}$ when the first switch branch L1 in the second control unit and the first switch branch L1 in the third control unit Q3 is switched on.

In one clock period T, the second clock signal from the second control line C2 may only be an effective voltage in the second time stage. In the second time stage t2, the second control line C2 may output a low-voltage signal to switch on the second switch branches L2 in two control units Q. When the second switch branch L2 in the second control unit Q2 is switched on, the corresponding shift register VSR may output the scanning signal to the (z+2)-th scan line $G_{z+2}$ through the second control unit Q2. The second switch branch L2 in the first control unit Q1 and the second switch branch L2 in the third control unit Q3 may be the auxiliary switch branches, and may output the high voltage signal provided by the first signal line H to the scan line $G_{z+1}$ and to the scan line $G_{z+3}$ when the second switch branch L2 in the first control unit Q1 and the second switch branch L2 in the third control unit Q3 are switched on.

In one clock period T, the third clock signal from the third control line C3 may only be an effective voltage in the third time stage. In the third time stage t3, the third control line C3 may output a low-voltage signal to switch on the third switch branch L3 in the three control units Q. When the third switch branch L3 in the third control unit Q3 is switched on, the corresponding shift register VSR may output the scanning signal to the (z+3)-th scan line $G_{z+3}$ through the third control unit Q3. The third switch branch L3 in the first control unit Q1 and the third switch branch L3 in the second control unit Q2 may be the auxiliary switch branch, and may output the high voltage signal provided by the first signal line H to the scan line $G_{z+1}$ and the scan line $G_{z+2}$ when the third switch branch L3 in the first control unit Q1 and the third switch branch L3 in the second control unit Q2 is switched on.

In the display panel provided by the embodiment of the present disclosure, each multiplexer may be connected to three scan lines arranged along the second direction sequentially. By switching on or off the switch branches in the multiplexer through the three control lines, the scanning signals may be outputted to three scan lines sequentially. Each shift register may drive three scan lines. Correspondingly, a number of the shift registers deployed in a frame of the display panel may be reduced by two-thirds compared to the current display technology where each shift register only controls one scan line. A space for the scan driving circuit in the frame of the display panel may be reduced. A narrow frame may be realized and the screen ratio may be improved.

Figure 12:
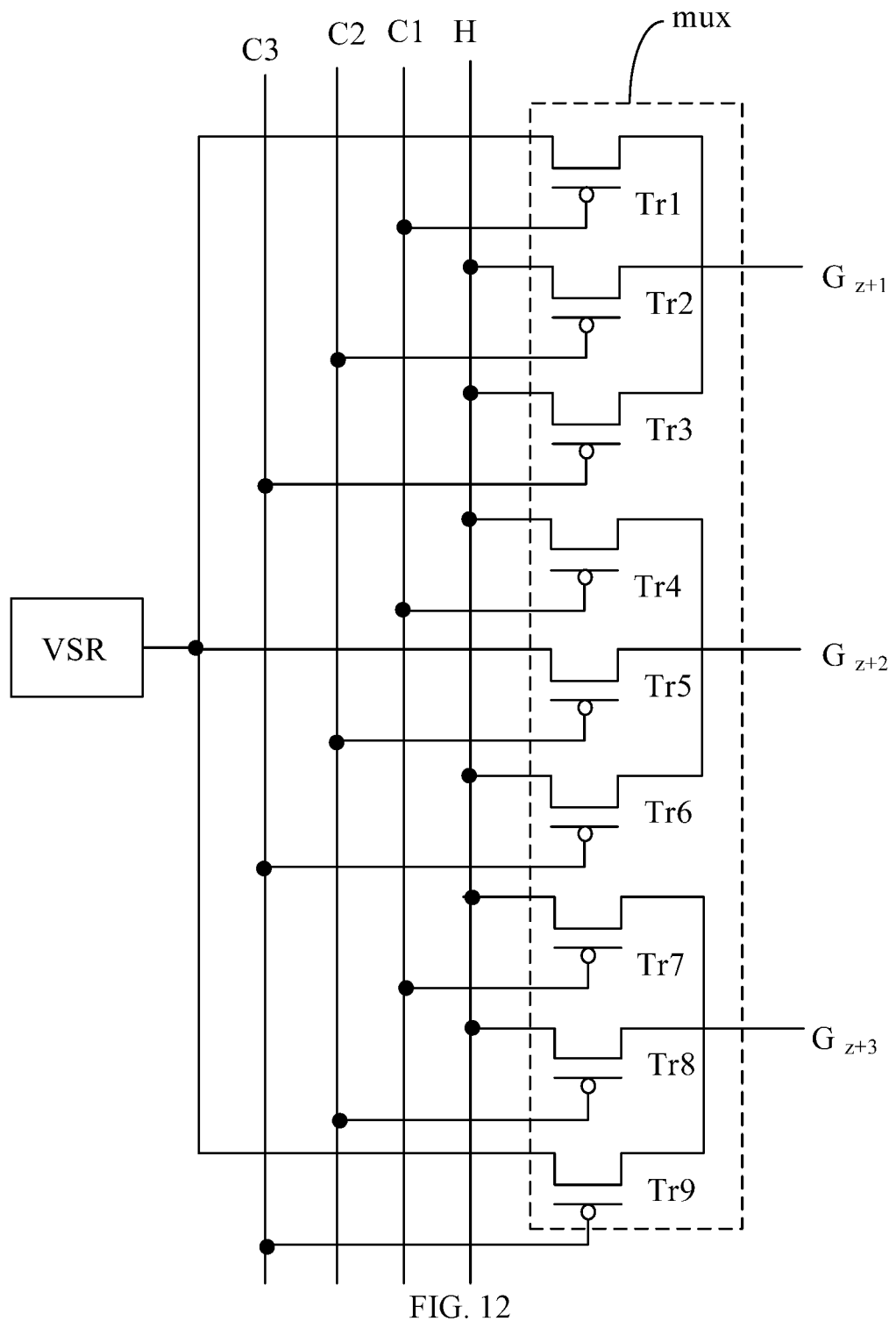
FIG. 12 illustrates a structure of another multiplexer for an exemplary display panel consistent with various disclosed embodiments in the present disclosure.

FIG. 12 illustrates a structure of another multiplexer in a display panel consistent with various embodiments of the present disclosure. Each multiplexer mux may include a first transistor Tr1, a second transistor Tr2, a third transistor Tr3, a fourth transistor Tr4, a fifth transistor Tr5, a sixth transistor Tr6, a seventh transistor Tr7, an eight transistor Tr8 and a ninth transistor Tr9. A gate electrode of the first transistor Tr1 may be connected to the first control line C1, and a first electrode of the first transistor Tr1 may be connected to the output terminal of the corresponding shift register VSR. A gate electrode of the second transistor Tr2 may be connected to the second control line C2 and a first electrode of the second transistor Tr2 may be connected to the first signal line H. A gate electrode of the third transistor Tr3 may be connected to the first control line C1 and a first electrode of the third transistor Tr3 may be connected to the first signal line H. A gate electrode of the fourth transistor Tr4 may be connected to the second control line C2 and a first electrode of the fourth transistor Tr4 may be connected to the first signal line H. In the fifth transistor Tr5, a gate electrode may be connected to the second control line C2 and a first electrode may be connected to the output terminal of the corresponding shift register VSR. In the sixth transistor Tr6, a gate electrode may be connected to the third control line C3 and a first electrode may be connected to the first signal line H. In the seventh transistor Tr7, a gate electrode may be connected to the first control line C1 and a first electrode may be connected to the first signal line H. In the eighth transistor, a gate electrode may be connected to the second control line C2 and a first electrode may be connected to the first signal line H. In the ninth transistor Tr9, a gate electrode may be connected to the third control line C3 and a first electrode may be connected to the output terminal of the corresponding shift register VSR. A second electrode of the first transistor Tr1, a second electrode of the second transistor and a second electrode of the third transistor Tr3 may be connected to a same scan line $G_{z+1}$. A second electrode of the fourth transistor Tr4, a second electrode of the fifth transistor Tr5 and a second electrode of the sixth transistor Tr6 may be connected to a same scan line $G_{z+2}$. A second electrode of the seventh transistor Tr7, a second electrode of the eighth transistor Tr8 and a second electrode of the ninth transistor Tr9 may be connected to a same scan line $G_{z+3}$. A time sequential diagram of the multiplexer in the present embodiment may be referred to FIG. 11.

In the display panel provided by the embodiment of the present disclosure, each multiplexer may be connected to three scan lines arranged along the second direction sequentially, and each transistor may be used as a switch branch. Each multiplexer may include nine transistors. By switching on or off nine transistors through the three control lines, the scanning signals may be outputted to three scan lines sequentially. Each shift register may drive three scan lines. Correspondingly, a number of the shift registers deployed in a frame of the display panel may be reduced by two-third compared to the current display technology where each shift register only controls one scan line. A space for the scan driving circuit in the frame of the display panel may be reduced and a narrow frame may be realized to improve the screen ratio.

Figure 13:
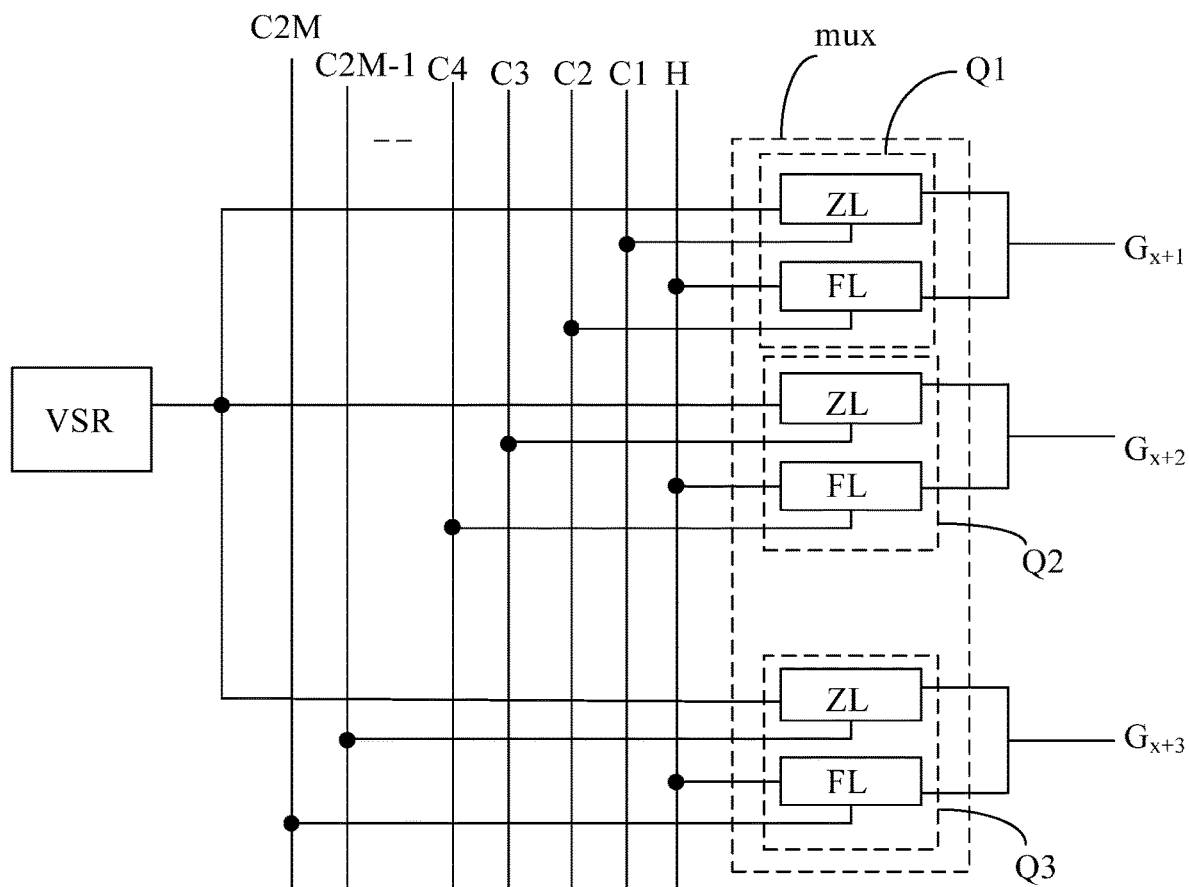
FIG. 13 illustrates a structure of another multiplexer for an exemplary display panel consistent with various disclosed embodiments in the present disclosure.

FIG. 13 illustrates a structure of another multiplexer in a display panel consistent with various embodiments of the present disclosure. The display panel may include a first control line C1, a second control line C2, . . . , a (2M)-th control line, and a first signal line H. Each control unit Q may include two switch branches L comprised of a main switch branch ZL and an auxiliary switch branch FL. In each control unit Q, a control terminal of each switch branch L may be connected to a control line C respectively. A number of the control lines may be as same as a number of the switch branches. Output terminals of the switch branches in the first control unit Q1 may be connected to the (x+1)-th scan line $G_{x+1}$; Output terminals of all switch branches in the second control unit Q2 may be connected to the (x+2)-th scan line $G_{x+2}$, . . . , and output terminals of all switch branches in the M-th control unit may be connected to the (x+M)-th scan line $G_{x+M}$, where x is zero or an integer multiple of M. When x is zero, the scan line $G_1$, the scan line $G_2$, . . . , and the scan line GM, may be arranged sequentially and may be the scan lines of the first-level shift register. When x is M, the scan line $G_{M+1}$, the scan line $G_{M+2}$, . . . , and the scan line $G_{M+M}$, may be arranged sequentially and may be the scan lines of the second-level shift register, and so on.

In the display panel provided by the embodiment of the present disclosure, the multiplexers may be deployed in the scan driving circuit. Each shift register may be connected to a multiplexer and each multiplexer may be connected to M scan lines arranged along the second direction sequentially. Each multiplex may include M control units and the control units are electrically connected to the scan lines one by one. A number of the control units may be same as a number of the scan lines connected to a multiplexer. The display panel may further include M control line and a first signal line. Each control unit may include two switch branches. Control terminals of the switch branches may be connected to the control lines. An input terminal of the main switch branch may be connected to the output terminal of the corresponding shift register, and input terminals of other switch branches may be connected to the first signal line. When the multiplexer receives the effective voltage in M consecutive time stages from the corresponding shift register, the multiplexer may switch on the main switch branch in each control unit sequentially and output scanning signals to the M scan lines sequentially. One shift register may drive M scan lines by combining the control lines, the first signal line and the multiplexer. Correspondingly, a number of the shift registers deployed in a frame of the display panel may be reduced compared to the current display technology where each shift register only controls one scan line. A space for the scan driving circuit in the frame of the display panel may be reduced and a narrow frame may be realized to improve the screen ratio.

In some embodiments, in one scanning period, the n-th control line may output an n-th clock signal, and the first signal line may output a first signal, where n is a positive integer and n≤2M. A clock period of each clock signal may include M time stages. In one clock period and in the m-th control unit, the control line connected to the main switch branch may only output the effective voltage level in the m-th time stage, and the control lines connected to the auxiliary switch branches may output ineffective voltage levels in the m-th time stage, where m is a positive integer and m≤M.

Figure 14:
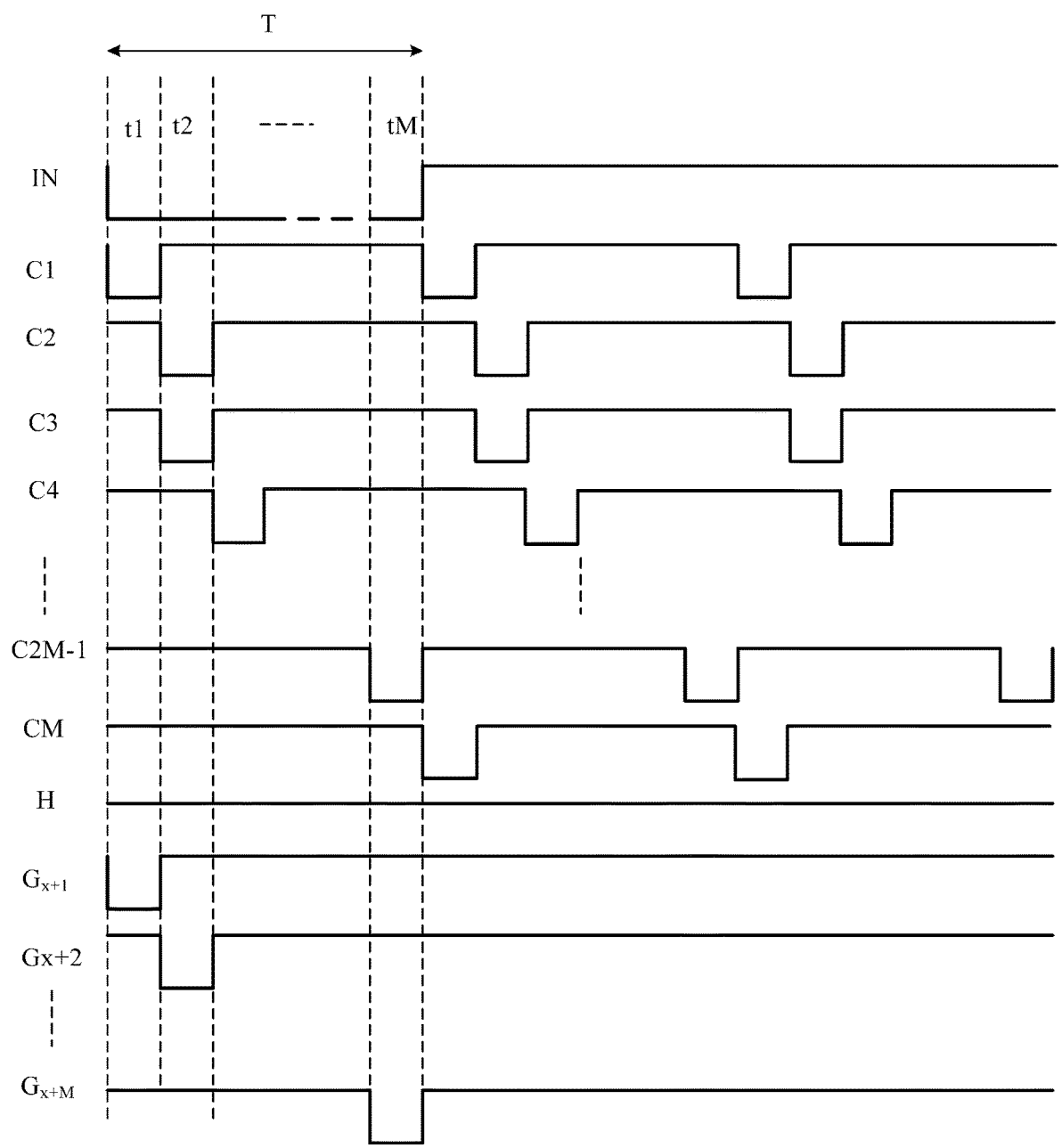
FIG. 14 illustrates a time sequence diagram of the multiplexer in FIG. 13 for a display panel consistent with various disclosed embodiments in the present disclosure.

FIG. 14 illustrates a time sequence diagram of the multiplexer in FIG. 13 for a display panel consistent with various disclosed embodiments in the present disclosure. The multiplexer may receive the effective voltage level IN in M consecutive time stages from the corresponding shift register VSR. For example, the effective voltage level may be a low voltage signal to drive the scan lines, and the first signal from the first signal line H may be a high-voltage signal and cannot drive the scan lines.

In one clock period T, in the first control unit Q1, the first control line C1 connected to the main switch branch ZL may only output an effective voltage level in the first time stage, while the second control line C2 connected to the auxiliary switch branch may output an ineffective voltage level in the first time stage. The time sequential diagram for the control line C2 in FIG. 14 is for exemplary only and it could be any shape as long as the auxiliary switch branch FL is switched off when the main switch branch ZL is switched on in the first control unit Q1. When the main switch branch ZL in the first control unit Q1 is switched on by the first clock signal from the first control line C1, the corresponding shift register VSR may output the scanning signal to the (x+1)-th scan line Gx+1 through the first control unit Q1. The main switch branches ZL in all other control units may be switched off. For example, the multiplexer may output the scanning signal to the scan line connected to the first control unit Q1 in the first time stage.

In one clock period T, in the second control unit Q2, the third control line C3 connected to the main switch branch ZL may only output the effective voltage level in the second time stage, and the fourth control line C4 connected to the auxiliary switch branch FL may output the ineffective voltage level in the second time stage. The time sequential diagram for the fourth control line C4 in FIG. 14 is for exemplary only and it could be any shape as long as the auxiliary switch branch FL is switched off when the main switch branch ZL is switched on in the second control unit Q2. In the second time stage t2, when the main switch branch ZL in the second control unit Q2 is switched on by the third clock signal from the third control line C3, the corresponding shift register VSR may output the scanning signal to the (x+2)-th scan line Gx+2 through the second control unit Q2. The main switch branches ZL in all other control units may be switched off. For example, the multiplexer may output the scanning signal to the scan line connected to the second control unit Q2 in the second time stage t2.

In the same way, In one clock period T, in the M-th control unit QM, the control line C2M−1 connected to the main switch branch ZL may only output the effective voltage level in the M-th time stage, and the (2M)-th control line C2M connected to the auxiliary switch branch FL may output the ineffective voltage level in the M-th time stage. The time sequential diagram for the (2M)-th control line C2M in FIG. 14 is for exemplary only and it could be any shape as long as the auxiliary switch branch FL is switched off when the main switch branch ZL is switched on in the M-th control unit QM. In the M-th time stage tM, when the main switch branch ZL in the M-th control unit QM is switched on by the third clock signal from the (2M−1)-th control line C2M−1, the corresponding shift register VSR may output the scanning signal to the (x+M)-th scan line Gx+M through the M-th control unit QM. The main switch branches ZL in all other control units may be switched off. For example, the multiplexer may output the scanning signal to the scan line connected to the M-th control unit QM in the M-th time stage tM.

Figure 15:
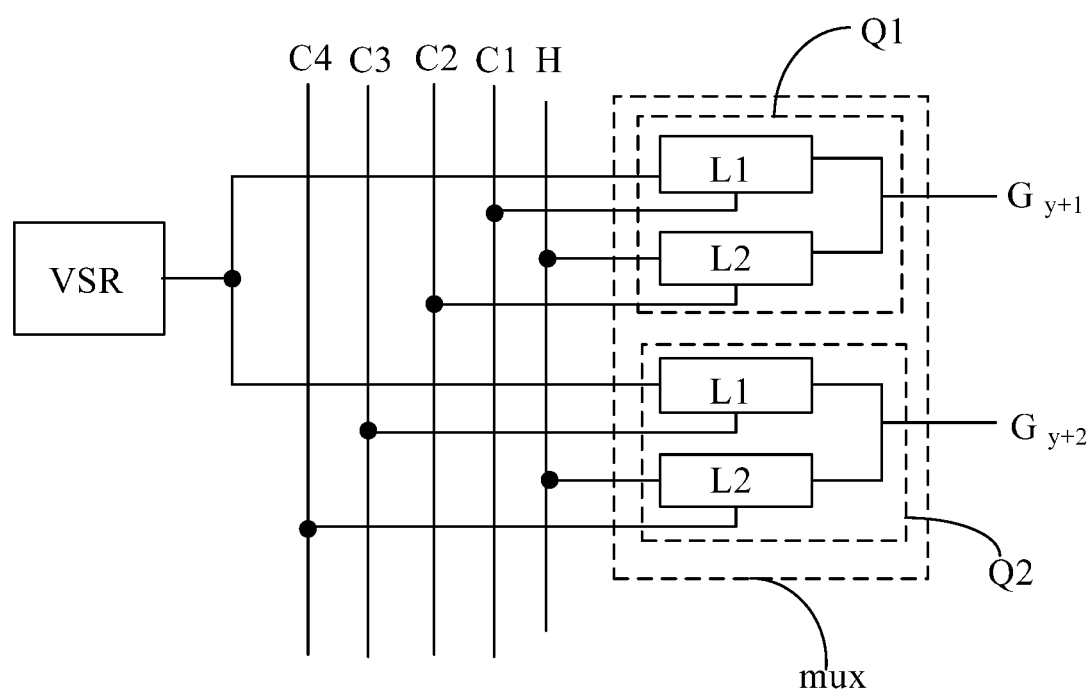
FIG. 15 illustrates a structure of another multiplexer for an exemplary display panel consistent with various disclosed embodiments in the present disclosure.

FIG. 15 illustrates a structure of another multiplexer in a display panel consistent with various embodiments of the present disclosure. In FIG. 15, M may be 2 and each multiplexer mux may include two control units Q.

In the first control unit Q1, the control terminal of the first switch branch L1 may be connected to the first control line C1 and the input terminal of the first switch branch L1 may be connected to the output terminal of the corresponding shift register VSR. The control terminal of the second switch branch L2 may be connected to the second control line C2 and the input terminal of the second switch branch L2 may be connected to the first signal line H. The output terminals of both two switch branches may be connected to the same scan line Gy+1.

In the second control unit Q2, the control terminal of the first switch branch L1 may be connected to the third control line C3 and the input terminal of the first switch branch L1 may be connected to the output terminal of the corresponding shift register VSR. The control terminal of the second switch branch L2 may be connected to the fourth control line C4 and the input terminal of the second switch branch L2 may be connected to the first signal line H. The output terminals of both two switch branches may be connected to the same scan line Gy+2 where y is zero or an integer multiple of 2. In the embodiment, y may be 0 or an integer multiple of 2. When y is zero, the scan line G1 and the scan line G2 may be arranged sequentially, and may be the scan lines driven by the first-level shift register VSR1. When y is 2, the scan line G3 and the scan line G4 may be arranged sequentially, and may be the scan lines driven by the second-level shift register VSR2. And so on.

Figure 16:
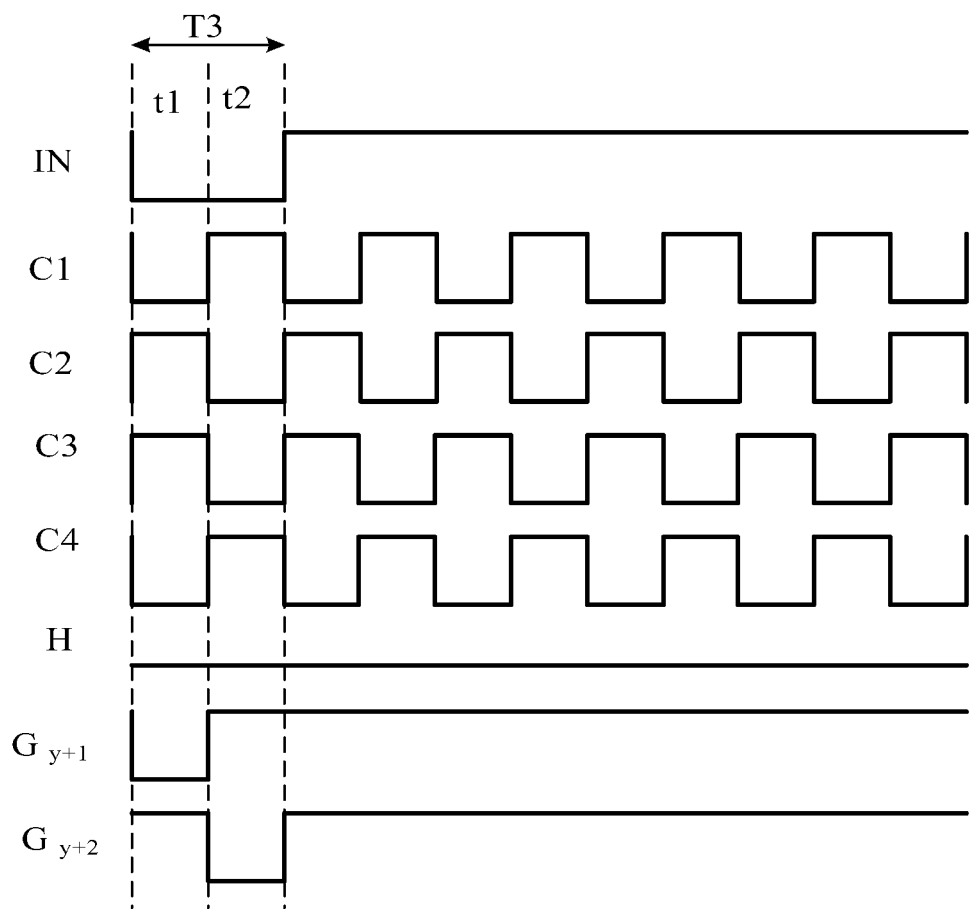
FIG. 16 illustrates a time sequence diagram of the multiplexer in FIG. 15 for a display panel consistent with various disclosed embodiments in the present disclosure.

FIG. 16 illustrates a time sequence diagram of the multiplexer in FIG. 15 for a display panel consistent with various disclosed embodiments in the present disclosure. The multiplexer may receive the effective voltage IN in two consecutive time stages from the corresponding shift register VSR. For example, the effective voltage may be a low voltage signal to drive the scan lines, and the first signal from the first signal line H may be a high-voltage signal and cannot drive the scan lines.

In one clock period T3, in the first control unit Q1, the first control line C1 connected to the main switch branch ZL (the first switch branch L1) may only output an effective voltage level in the first time stage, while the second control line C2 connected to the auxiliary switch branch FL (the second switch branch L2) may output an ineffective voltage level in the first time stage. The time sequential diagram for the control line C2 in FIG. 16 is for exemplary only and it could be any shape as long as the auxiliary switch branch FL is switched off when the main switch branch ZL is switched on in the first control unit Q1. In the first time stage, when the main switch branch ZL in the first control unit Q1 is switched on by the first clock signal from the first control line C1, the corresponding shift register VSR may output the scanning signal to the (y+1)-th scan line $G_{y+1}$ through the first control unit Q1. The first switch branches L1 in the second control unit Q2 may be switched off. For example, the multiplexer may output the scanning signal to the scan line connected to the first control unit Q1 in the first time stage t1.

In one clock period T3, in the second control unit Q2, the third control line C3 connected to the main switch branch ZL (the first switch branch L1) may only output the effective voltage level in the second time stage, and the fourth control line C4 connected to the auxiliary switch branch FL (the second switch branch L2) may output the ineffective voltage level in the second time stage. The time sequential diagram for the fourth control line C4 in FIG. 16 is for exemplary only and it could be any shape as long as the auxiliary switch branch FL is switched off when the main switch branch ZL is switched on in the second control unit Q2. In the second time stage t2, when the main switch branch ZL in the second control unit Q2 is switched on by the third clock signal from the third control line C3, the corresponding shift register VSR may output the scanning signal to the (y+2)-th scan line $G_{y+2}$ through the second control unit Q2. The first switch branch L1 in the first control unit Q1 may be switched off. For example, the multiplexer may output the scanning signal to the scan line connected to the second control unit Q2 in the second time stage t2.

In the display panel provided by the embodiment of the present disclosure, each multiplexer may be connected to two scan lines arranged along the second direction sequentially. By switching on or off four switch branches in two control units through the two control lines, the scanning signals may be outputted to two scan lines sequentially. Each shift register may drive two scan lines. Correspondingly, a number of the shift registers deployed in a frame of the display panel may be reduced by half compared to the current display technology where each shift register only controls one scan line. A space for the scan driving circuit in the frame of the display panel may be reduced and a narrow frame may be realized to improve the screen ratio.

Figure 17:
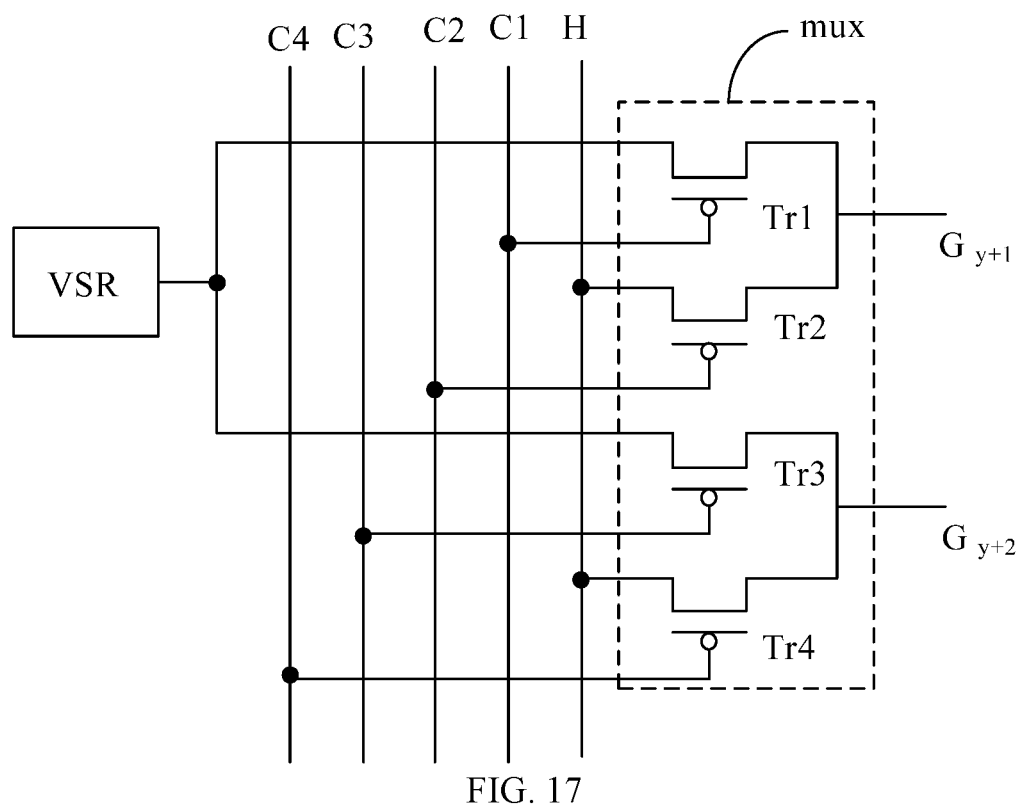
FIG. 17 illustrates a structure of another multiplexer for an exemplary display panel consistent with various disclosed embodiments in the present disclosure.

FIG. 17 illustrates a structure of another multiplexer in a display panel consistent with various embodiments of the present disclosure. Each multiplexer mux may include a first transistor Tr1, a second transistor Tr2, a third transistor Tr3, and a fourth transistor Tr4. A gate electrode of the first transistor Tr1 may be connected to the first control line C1, and a first electrode of the first transistor Tr1 may be connected to the output terminal of the corresponding shift register VSR. A gate electrode of the second transistor Tr2 may be connected to the second control line C2 and a first electrode of the second transistor Tr2 may be connected to the first signal line H. A gate electrode of the third transistor Tr3 may be connected to the first control line C1 and a first electrode of the third transistor Tr3 may be connected to the first signal line H. A gate electrode of the fourth transistor Tr4 may be connected to the second control line C2 and a first electrode of the fourth transistor Tr4 may be connected to the output terminal of the corresponding shift register VSR. A second electrode of the first transistor Tr1 and a second electrode of the second transistor Tr2 may be connected to a same scan line $G_{y+1}$. The second electrode of the third transistor Tr3 and a second electrode of the fourth transistor Tr4 may be connected to a same scan line $G_{y+2}$. A time sequential diagram of the multiplexer in the present embodiment may be referred to FIG. 16.

In the display panel provided by the embodiment of the present disclosure, each multiplexer may be connected to two scan lines arranged along the second direction sequentially, and each transistor may be used as a switch branch. By switching on or off four transistors in two control units through the two control lines, the scanning signals may be outputted to two scan lines sequentially. Each shift register may drive two scan lines. Correspondingly, a number of the shift registers deployed in a frame of the display panel may be reduced by half compared to the current display technology where each shift register only controls one scan line. A space for the scan driving circuit in the frame of the display panel may be reduced and a narrow frame may be realized to improve the screen ratio.

Figure 18:
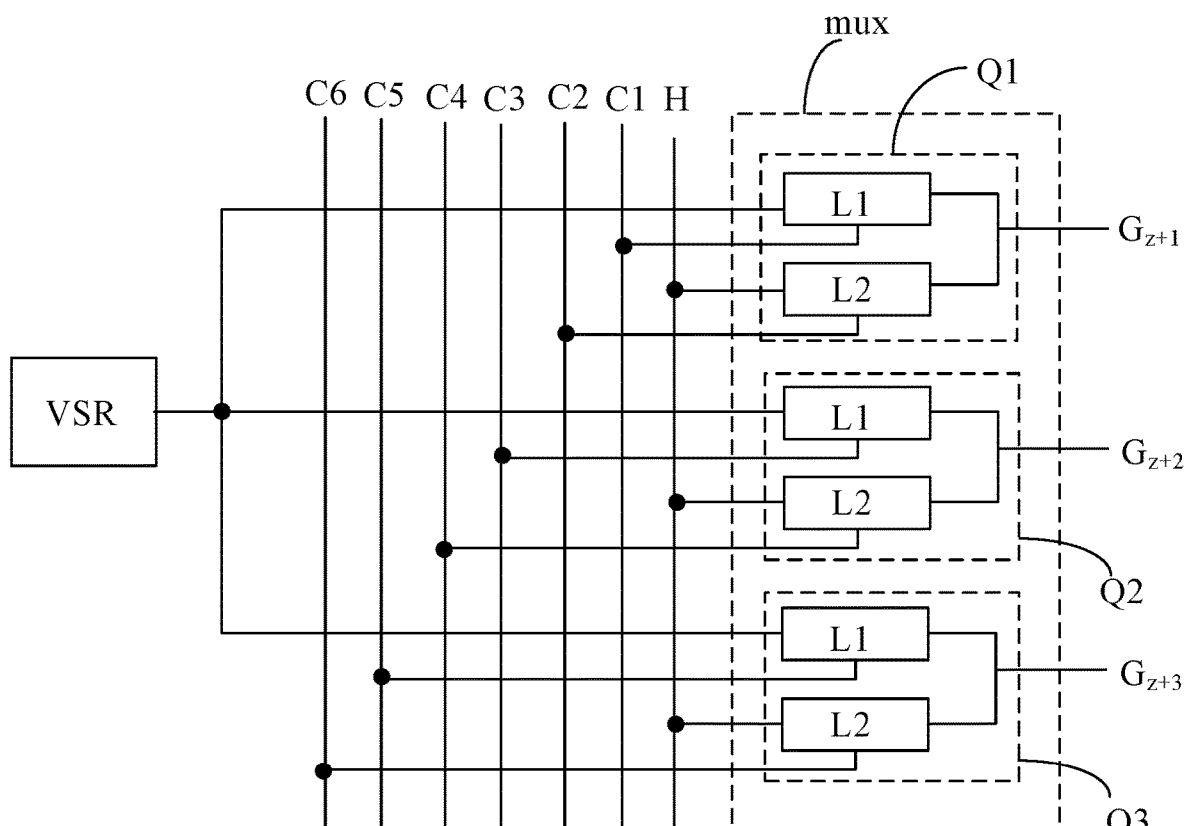
FIG. 18 illustrates a structure of another multiplexer for an exemplary display panel consistent with various disclosed embodiments in the present disclosure.

FIG. 18 illustrates a structure of another multiplexer in a display panel consistent with various embodiments of the present disclosure. In FIG. 18, M may be 3 and each multiplexer mux may include three control units Q.

In the first control unit Q1, the control terminal of the first switch branch L1 may be connected to the first control line C1 and the input terminal of the first switch branch L1 may be connected to the output terminal of the corresponding shift register VSR. The control terminal of the second switch branch L2 may be connected to the second control line C2 and the input terminal of the second switch branch L2 may be connected to the first signal line H. The output terminals of both two switch branches may be connected to the same scan line $G_{z+1}$.

In the second control unit Q2, the control terminal of the first switch branch L1 may be connected to the third control line C3 and the input terminal of the first switch branch L1 may be connected to the output terminal of the corresponding shift register VSR. The control terminal of the second switch branch L2 may be connected to the fourth control line C4 and the input terminal of the second switch branch L2 may be connected to the first signal line H. The output terminals of both two switch branches may be connected to the same scan line $G_{z+2}$.

In the third control unit Q3, the control terminal of the first switch branch L1 may be connected to the fifth control line C5 and the input terminal of the first switch branch L1 may be connected to the output terminal of the corresponding shift register VSR. The control terminal of the second switch branch L2 may be connected to the sixth control line C6 and the input terminal of the second switch branch L2 may be connected to the first signal line H. The output terminals of both two switch branches may be connected to the same scan line $G_{z+3}$.

In the present embodiment, z may be zero or an integer multiple of 3. When z is zero, the scan line $G_1$, the scan line $G_2$ and the scan line $G_3$ may be arranged sequentially, and may be the scan lines driven by the first-level shift register VSR1. When z is 3, the scan line $G_4$, the scan line $G_5$ and the scan line $G_6$ may be arranged sequentially, and may be the scan lines driven by the second-level shift register VSR2. And so on.

Figure 19:
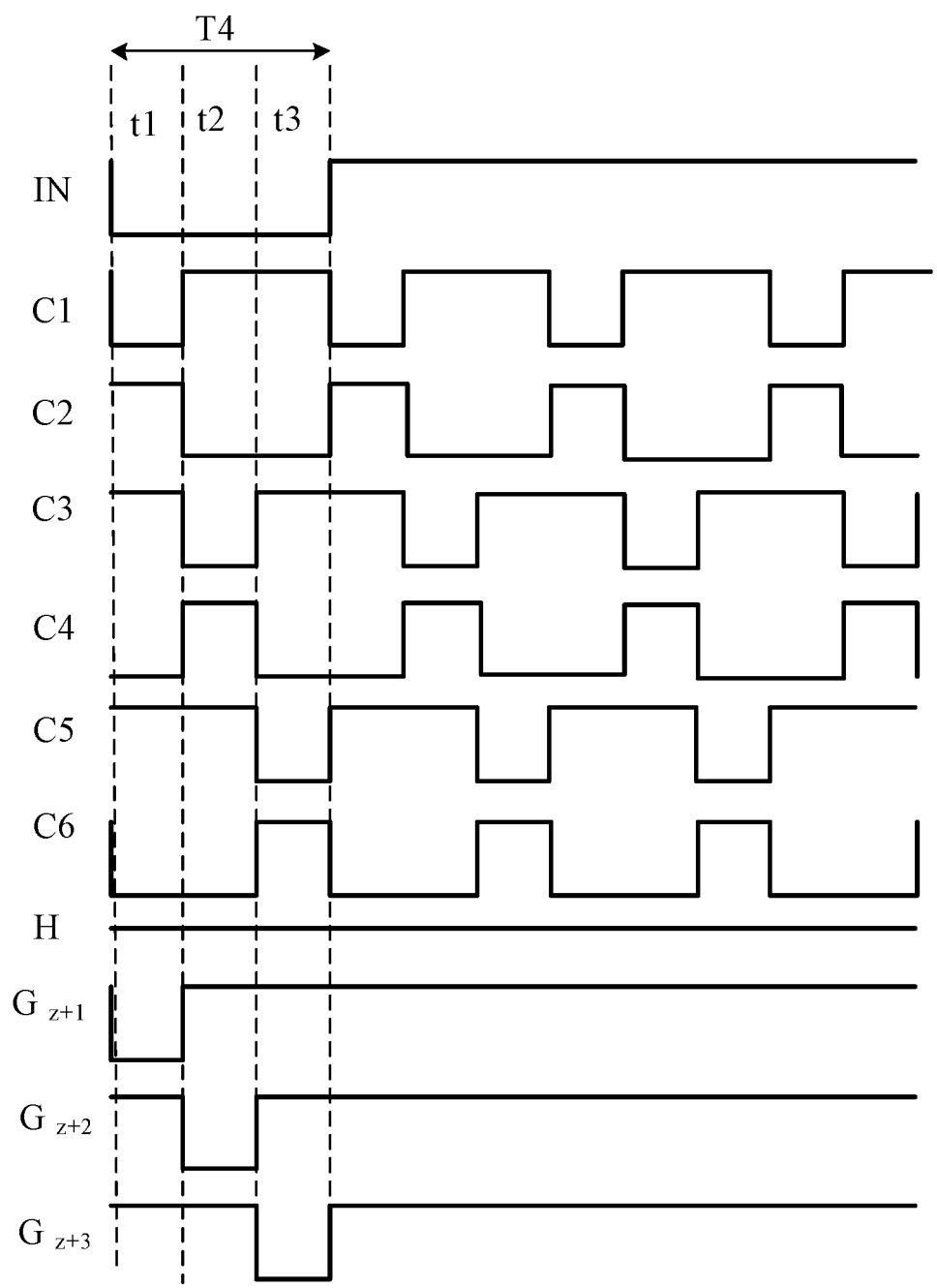
FIG. 19 illustrates a time sequence diagram of the multiplexer in FIG. 18 for a display panel consistent with various disclosed embodiments in the present disclosure.

FIG. 19 illustrates a time sequence diagram of the multiplexer in FIG. 18 for a display panel consistent with various disclosed embodiments in the present disclosure. The multiplexer mux may receive the effective voltage IN in three consecutive time stages from the corresponding shift register VSR. For example, the effective voltage may be a low voltage signal to drive the scan lines, and the first signal from the first signal line H may be a high-voltage signal and cannot drive the scan lines.

In one clock period T4, in the first control unit Q1, the first control line C1 connected to the main switch branch ZL (the first switch branch L1) may only output an effective voltage level in the first time stage, while the second control line C2 connected to the auxiliary switch branch FL (the second switch branch L2) may output an ineffective voltage level in the first time stage. The time sequential diagram for the control line C2 in FIG. 19 is for exemplary only and it could be any shape as long as the auxiliary switch branch FL is switched off when the main switch branch ZL is switched on in the first control unit Q1. In the first time stage t1, when the main switch branch ZL in the first control unit Q1 is switched on by the first clock signal from the first control line C1, the corresponding shift register VSR may output the scanning signal to the (z+1)-th scan line $G_{z+1}$ through the first control unit Q1. The first switch branches L1 in the second control unit Q2 and the first switch branch L1 in the third control unit may be switched off. For example, the multiplexer may output the scanning signal to the scan line connected to the first control unit Q1 in the first time stage t1.

In one clock period T4, in the second control unit Q2, the third control line C3 connected to the main switch branch ZL (the first switch branch L1) may only output the effective voltage level in the second time stage, and the fourth control line C4 connected to the auxiliary switch branch FL (the second switch branch L2) may output the ineffective voltage level in the second time stage. The time sequential diagram for the fourth control line C4 in FIG. 16 is for exemplary only and it could be any shape as long as the auxiliary switch branch FL is switched off when the main switch branch ZL is switched on in the second control unit Q2. In the second time stage t2, when the main switch branch ZL in the second control unit Q2 is switched on by the third clock signal from the third control line C3, the corresponding shift register VSR may output the scanning signal to the (z+2)-th scan line $G_{z+2}$ through the second control unit Q2. The first switch branch L1 in the first control unit Q1 and the first switch branch L1 in the third control unit may be switched off. For example, the multiplexer may output the scanning signal to the scan line connected to the second control unit Q2 in the second time stage t2.

In one clock period T4, in the third control unit Q3, the fifth control line C5 connected to the main switch branch ZL (the first switch branch L1) may only output the effective voltage level in the second time stage, and the sixth control line C6 connected to the auxiliary switch branch FL (the second switch branch L2) may output the ineffective voltage level in the second time stage. The time sequential diagram for the fourth control line C4 in FIG. 19 is for exemplary only and it could be any shape as long as the auxiliary switch branch FL is switched off when the main switch branch ZL is switched on in the third control unit Q3. In the third time stage t2, when the main switch branch ZL in the third control unit Q3 is switched on by the fifth clock signal from the fifth control line C5, the corresponding shift register VSR may output the scanning signal to the (z+3)-th scan line $G_{z+3}$ through the third control unit Q3. The first switch branch L1 in the first control unit Q1 and the first switch branch L1 in the second control unit Q2 may be switched off. For example, the multiplexer may output the scanning signal to the scan line connected to the third control unit Q3 in the third time stage t3.

In the display panel provided by the embodiment of the present disclosure, each multiplexer may be connected to three scan lines arranged along the second direction sequentially. By switching on or off the switch branches in the multiplexer through the three control lines, the scanning signals may be outputted to three scan lines sequentially. Each shift register may drive three scan lines. Correspondingly, a number of the shift registers deployed in a frame of the display panel may be reduced by two-third compared to the current display technology where each shift register only controls one scan line. A space for the scan driving circuit in the frame of the display panel may be reduced. A narrow frame may be realized and the screen ratio may be improved.

Figure 20:
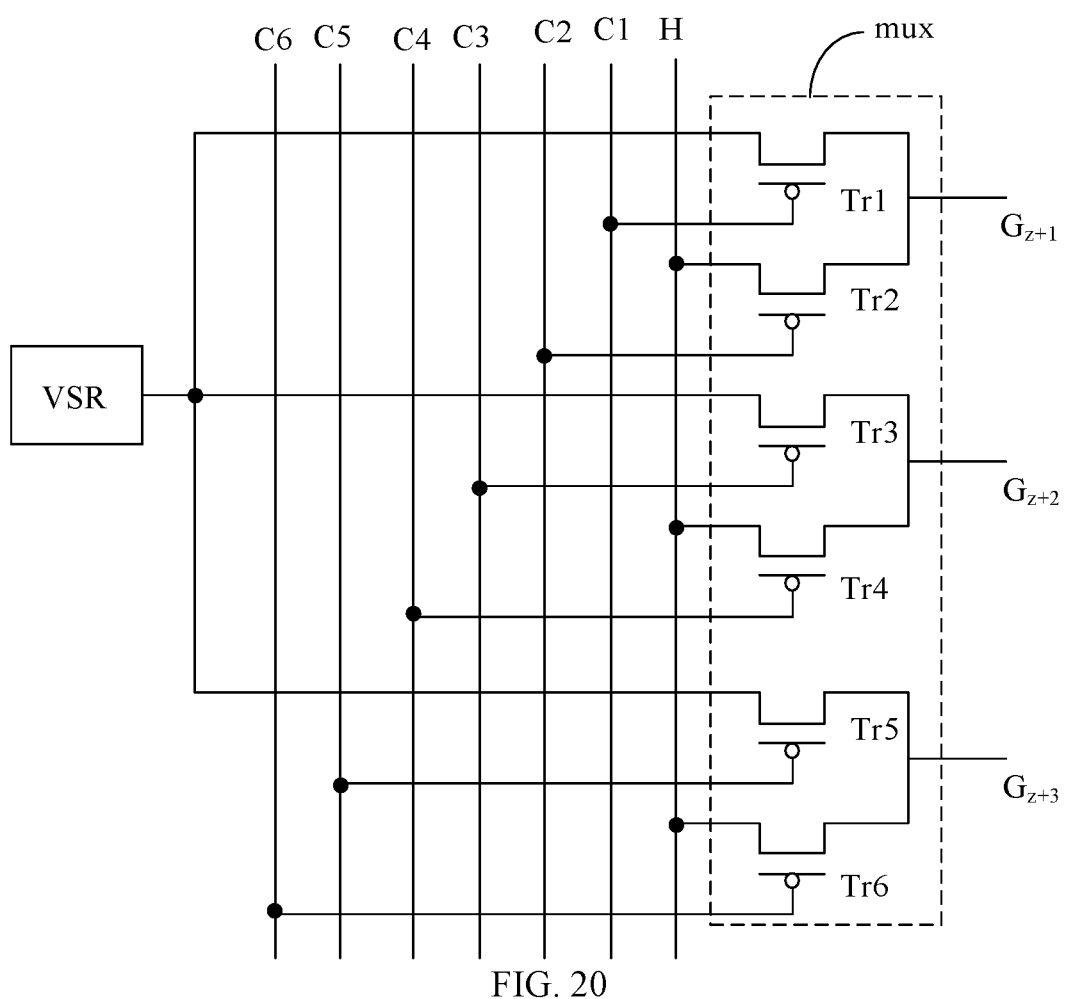
FIG. 20 illustrates a structure of another multiplexer for an exemplary display panel consistent with various disclosed embodiments in the present disclosure.

FIG. 20 illustrates a structure of another multiplexer in a display panel consistent with various embodiments of the present disclosure. Each multiplexer mux may include a first transistor Tr1, a second transistor Tr2, a third transistor Tr3, a fourth transistor Tr4, a fifth transistor Tr5, and a sixth transistor Tr6. A gate electrode of the first transistor Tr1 may be connected to the first control line C1, and a first electrode of the first transistor Tr1 may be connected to the output terminal of the corresponding shift register VSR. A gate electrode of the second transistor Tr2 may be connected to the second control line C2 and a first electrode of the second transistor Tr2 may be connected to the first signal line H. A gate electrode of the third transistor Tr3 may be connected to the first control line C1 and a first electrode of the third transistor Tr3 may be connected to the first signal line H. A gate electrode of the fourth transistor Tr4 may be connected to the second control line C2 and a first electrode of the fourth transistor Tr4 may be connected to the first signal line H. In the fifth transistor Tr5, a gate electrode may be connected to the second control line C2 and a first electrode may be connected to the output terminal of the corresponding shift register VSR. In the sixth transistor Tr6, a gate electrode may be connected to the third control line C3 and a first electrode may be connected to the first signal line H. A second electrode of the first transistor Tr1 and a second electrode of the second transistor may be connected to a same scan line $G_{z+1}$. A second electrode of the third transistor Tr3 and a second electrode of the fourth transistor Tr4 may be connected to a same scan line $G_{z+2}$. A second electrode of the fifth transistor Tr5 and a second electrode of the sixth transistor Tr6 may be connected to a same scan line $G_{z+3}$. A time sequential diagram of the multiplexer in the present embodiment may be referred to FIG. 19.

In the display panel provided by the embodiment of the present disclosure, each multiplexer may be connected to three scan lines arranged along the second direction sequentially, and each transistor may be used as a switch branch. Each multiplexer may include six transistors. By switching on or off six transistors through the six control lines, the scanning signals may be outputted to three scan lines sequentially. Each shift register may drive three scan lines. Correspondingly, a number of the shift registers deployed in a frame of the display panel may be reduced by two-third compared to the current display technology where each shift register only controls one scan line. A space for the scan driving circuit in the frame of the display panel may be reduced and a narrow frame may be realized to improve the screen ratio.

In various embodiments, when the multiplexer uses transistors as the switch branches, channels of the transistors may have a width W of 3 $\mu m \leq W \leq 300$ and a length D of 1 $\mu m \leq W \leq 30\,\mu m$. The transistors may have a small size and the multiplexer may occupy a small space in the frame of the display panel.

Figure 21:
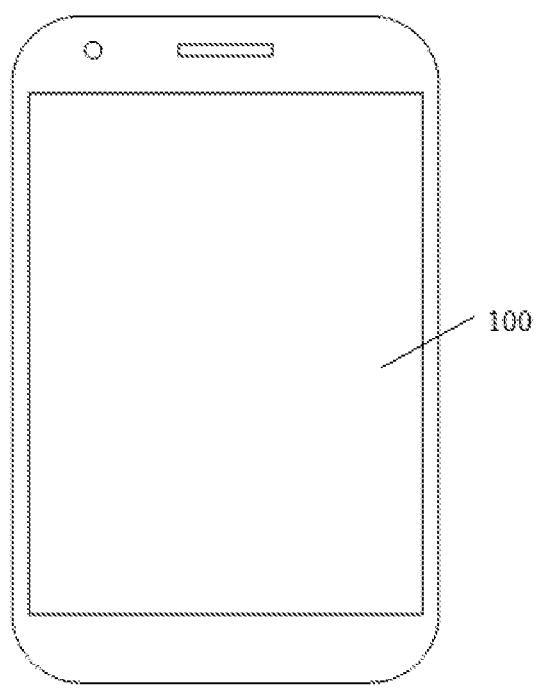
FIG. 21 illustrates an exemplary display device consistent with various disclosed embodiments in the present disclosure.

Various embodiments of the present disclosure also provide a display device. FIG. 21 illustrates a structure of a display device consistent with various embodiments of the present disclosure. The display device may include a display panel 100 provided by any embodiments of the present disclosure. The display device provided by the present disclosure may be any electronic produce with a display function, including but not limited to: a television, a laptop computer, a desktop monitor, a tablet, a digital camera, a cell phone, a smart bracelet, a smart eyeglass, a vehicle monitor, a medical equipment, an industrial control equipment, a touching interactive terminal, and so on.

In the display panel and the display device provided by the present disclosure, a shift register may drive M scan lines. Correspondingly, a number of the shift registers deployed in a frame of the display panel may be reduced compared to the current display technology where each shift register only controls one scan line. A space for the scan driving circuit in the frame of the display panel may be reduced and a narrow frame may be realized to improve the screen ratio.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
a plurality of scan lines; and
a scan driving circuit, configured to drive the plurality of scan lines;
wherein:
the plurality of scan lines extend along a first direction and are arranged sequentially along a second direction, wherein the first direction and the second direction intersect each other;
the scan driving circuit includes shift registers and multiplexers;
the shift registers are in a cascaded configuration;
one shift register is electrically connected to one multiplexer;
the one multiplexer is electrically connected to M scan lines arranged sequentially along the second direction, wherein M is a positive integer and M≥2;
the shift registers have output terminals and input terminals;
the shift registers include a first level shift register, a second level shift register, until an N-th level shift register, wherein N is a positive integer and N≥2;
an input terminal of the first level shift register receives an initial shift signal of the display panel;
an input terminal of each level shift register, from the second-level shift register to the N-th-level shift register, is electrically connected to an output terminal of a previous-level shift register;
the one multiplexer includes M control units that are electrically connected to the M scan lines in a one-to-one correspondence;
the control unit includes switch branches, and output terminals of all switch branches in a same control unit are electrically connected to one same scan line;
the switch branches in the same control unit include a main switch branch and at least one auxiliary switch branch;
an input terminal of the main switch branch is electrically connected to an output terminal of a corresponding shift register;
an input terminal of the auxiliary switch branch is electrically connected to a first signal line;
in one scanning period, the initial shift signal includes an effective voltage level in M consecutive time stages and a signal outputted by each level shift register to a corresponding multiplexer includes the effective voltage level in the M consecutive time stages; and
in the M consecutive time stages, the main switch branches in the control units of the corresponding multiplexer are sequentially switched on, and sequentially output a scanning signal to the M scan lines,
wherein the display panel further includes:
a first control line, a second control line, a third control line, until an M-th control line; and one first signal line, wherein:
one control unit includes M switch branches;
the M switch branches include one main switch branch and (M−1) auxiliary switch branches;
in each control unit, a control terminal of an m-th switch branch is electrically connected to an m-th control line, wherein m is a positive integer and m≤M; and
in the one multiplexer, the m-th switch branch in the m-th control unit is used as the main switch branch of the m-th control unit, wherein:
M=2;
the multiplexer includes two control units;
one control unit includes two switch branches, the two switch branches including one main switch branch and one auxiliary switch branch;
in a first control unit of the two control units, a first switch branch is used as a main switch branch; a control terminal of the first switch branch is electrically connected to the first control line; an input terminal of the first switch branch is electrically connected to the output terminal of the corresponding shift register; the control terminal of a second switch branch is electrically connected to the second control line; the input terminal of the second switch branch is electrically connected to the first signal line; and output terminals of the first and second switch branches are electrically connected to a same scan line; and
in the second control unit of the two control unit, a control terminal of a first switch branch is electrically connected to the first control line; an input terminal of the first switch branch is electrically connected to the first signal line; a second switch branch is used as a main switch branch; a control terminal of the second switch branch is electrically connected to the second control line; an input terminal of the second switch branch is electrically connected to the output terminal of the corresponding shift register; and output terminals of the first and the second switch branches are electrically connected a same scan line.

2. The display panel according to claim 1, wherein:
in the one scanning period, the m-th control line provides an m-th clock signal and the first signal line provides a first signal;
one clock period of each clock signal includes M consecutive time stages;
in one clock period, the m-th clock signal is the effective voltage level only in the m-th time stage; and
in the one multiplexer, in the m-th time stage, the multiplexer outputs the scanning signal to the scan line electrically connected to the m-th control unit in the multiplexer.

3. The display panel according to claim 1, wherein:
the multiplexer includes a first transistor, a second transistor, a third transistor, and a fourth transistor;
in the first transistor, a gate electrode is electrically connected to the first control line and a first electrode is electrically connected to the output terminal of the corresponding shift register;
in the second transistor, a gate electrode is electrically connected to the second control line and a first electrode is electrically connected to the first signal line;
in the third transistor, a gate electrode is electrically connected to the first control line and a first electrode is electrically connected to the first signal line;
in the fourth transistor, a gate electrode is electrically connected to the second control line and a first electrode is electrically connected to the output terminal of the corresponding shift register;
a second electrode in the first transistor and a second electrode in the second transistor are electrically connected to one same scan line; and
a second electrode in the third transistor and a second electrode in the fourth transistor are electrically connected to one same scan line.

4. A display panel, comprising:
a plurality of scan lines; and
a scan driving circuit, configured to drive the plurality of scan lines;
wherein:
the plurality of scan lines extend along a first direction and are arranged sequentially along a second direction, wherein the first direction and the second direction intersect each other;
the scan driving circuit includes shift registers and multiplexers;
the shift registers are in a cascaded configuration;
one shift register is electrically connected to one multiplexer;
the one multiplexer is electrically connected to M scan lines arranged sequentially along the second direction, wherein M is a positive integer and M≥2;
the shift registers have output terminals and input terminals;
the shift registers include a first level shift register, a second level shift register, until an N-th level shift register, wherein N is a positive integer and N≥2;
an input terminal of the first level shift register receives an initial shift signal of the display panel;
an input terminal of each level shift register, from the second-level shift register to the N-th-level shift register, is electrically connected to an output terminal of a previous-level shift register;
the one multiplexer includes M control units that are electrically connected to the M scan lines in a one-to-one correspondence;
the control unit includes switch branches, and output terminals of all switch branches in a same control unit are electrically connected to one same scan line;
the switch branches in the same control unit include a main switch branch and at least one auxiliary switch branch;
an input terminal of the main switch branch is electrically connected to an output terminal of a corresponding shift register;
an input terminal of the auxiliary switch branch is electrically connected to a first signal line;
in one scanning period, the initial shift signal includes an effective voltage level in M consecutive time stages and a signal outputted by each level shift register to a corresponding multiplexer includes the effective voltage level in the M consecutive time stages; and
in the M consecutive time stages, the main switch branches in the control units of the corresponding multiplexer are sequentially switched on, and sequentially output a scanning signal to the M scan lines,
wherein the display panel further includes:
a first control line, a second control line, a third control line, until an M-th control line; and one first signal line, wherein:
one control unit includes M switch branches;
the M switch branches include one main switch branch and (M−1) auxiliary switch branches;
in each control unit, a control terminal of an m-th switch branch is electrically connected to an m-th control line, wherein m is a positive integer and m≤M; and
in the one multiplexer, the m-th switch branch in the m-th control unit is used as the main switch branch of the m-th control unit,
wherein:
in the one scanning period, the m-th control line provides an m-th clock signal and the first signal line provides a first signal;
one clock period of each clock signal includes M consecutive time stages;
in one clock period, the m-th clock signal is the effective voltage level only in the m-th time stage; and
in the one multiplexer, in the m-th time stage, the multiplexer outputs the scanning signal to the scan line electrically connected to the m-th control unit in the multiplexer,
wherein:
M=3;
the multiplexer includes three control units;
the one control unit includes three switch branches; the three switch branches includes one main switch branch and two auxiliary switch branches;
in a first control unit of the three control units, a first switch branch is used as a main switch branch; a control terminal of the first switch branch is electrically connected to the first control line; an input terminal of the first switch branch is electrically connected to the output terminal of the corresponding shift register; a control terminal of a second switch branch is electrically connected to the second control line; an input terminal of the second switch branch is electrically connected to the first signal line; a control terminal of the a switch branch is electrically connected to the third control line; an input terminal of the third switch branch is electrically connected to the first signal line; output terminals of all three switch branches are electrically connected to one same scan line;
in a second control unit of the three control unit, a control terminal of a first switch branch is electrically connected to the first control line; an input terminal of the first switch branch is electrically connected to the first signal line; a second switch branch is used as a main switch branch; a control terminal of the second switch branch is electrically connected to the second control line; an input terminal of the second switch branch is electrically connected to the output terminal of the corresponding shift register; a control terminal of a third switch branch is electrically connected to the third control line; an input terminal of the third switch branch is electrically connected to the first signal line; output terminals of all three switch branches are electrically connected to one same scan line; and
in a third control unit, a control terminal of a first switch branch is electrically connected to the first control line; an input terminal of the first switch branch is electrically connected to the first signal line; a control terminal of a second switch branch is electrically connected to the second control line; an input terminal of the second switch branch is electrically connected to the first signal line; a third switch branch is used as a main switch branch; a control terminal of the third switch branch is electrically connected to the third control line; an input terminal of the third switch branch is electrically connected to the output terminal of the corresponding shift register; output terminals of all three switch branches are electrically connected one same scan line.

5. The display panel according to claim 4, wherein:
the multiplexer includes a first transistor, a second transistor, a third transistor, a fourth transistor, a fifth transistor, a sixth transistor, a seventh transistor, an eighth transistor and a ninth transistor;

in the first transistor, a gate electrode is electrically connected to the first control line and a first electrode is electrically connected to the output terminal of the corresponding shift register;
in the second transistor, a gate electrode is electrically connected to the second control line and a first electrode is electrically connected to the first signal line;
in the third transistor, a gate electrode is electrically connected to the third control line and a first electrode is electrically connected to the first signal line;
in the fourth transistor, a gate electrode is electrically connected to the first control line and a first electrode is electrically connected to the first signal line;
in the fifth transistor, a gate electrode is electrically connected to the second control line and a first electrode is electrically connected to the output terminal of the corresponding shift register;
in the sixth transistor, a gate electrode is electrically connected to the third control line and a first electrode is electrically connected to the first signal line;
in the seventh transistor, a gate electrode is electrically connected to the first control line and a first electrode is electrically connected to the first signal line;
in the eighth transistor, a gate electrode is electrically connected to the second control line and a first electrode is electrically connected to the first signal line;
in the sixth transistor, a gate electrode is electrically connected to the third control line and a first electrode is electrically connected to the output terminal of the corresponding shift register;
a second electrode of the first transistor, a second electrode of the second transistor, and a second electrode of the third transistor are electrically connected to a same scan line;
a second electrode of the fourth transistor, a second electrode of the fifth transistor, and a second electrode of the sixth transistor are electrically connected to a same scan line; and
a second electrode of the seventh transistor, a second electrode of the eighth transistor, and a second electrode of the ninth transistor are electrically connected to a same scan line.

6. A display panel, comprising:
a plurality of scan lines; and
a scan driving circuit, configured to drive the plurality of scan lines;
wherein:
the plurality of scan lines extend along a first direction and are arranged sequentially along a second direction, wherein the first direction and the second direction intersect each other;
the scan driving circuit includes shift registers and multiplexers;
the shift registers are in a cascaded configuration;
one shift register is electrically connected to one multiplexer;
the one multiplexer is electrically connected to M scan lines arranged sequentially along the second direction, wherein M is a positive integer and M≥2;
the shift registers have output terminals and input terminals;
the shift registers include a first level shift register, a second level shift register, until an N-th level shift register, wherein N is a positive integer and N≥2;
an input terminal of the first level shift register receives an initial shift signal of the display panel;
an input terminal of each level shift register, from the second-level shift register to the N-th-level shift register, is electrically connected to an output terminal of a previous-level shift register;
the one multiplexer includes M control units that are electrically connected to the M scan lines in a one-to-one correspondence;
the control unit includes switch branches, and output terminals of all switch branches in a same control unit are electrically connected to one same scan line;
the switch branches in the same control unit include a main switch branch and at least one auxiliary switch branch;
an input terminal of the main switch branch is electrically connected to an output terminal of a corresponding shift register;
an input terminal of the auxiliary switch branch is electrically connected to a first signal line;
in one scanning period, the initial shift signal includes an effective voltage level in M consecutive time stages and a signal outputted by each level shift register to a corresponding multiplexer includes the effective voltage level in the M consecutive time stages; and
in the M consecutive time stages, the main switch branches in the control units of the corresponding multiplexer are sequentially switched on, and sequentially output a scanning signal to the M scan lines,
wherein the display panel further includes:
a first control line, a second control line, a third control line, until a 2M-th control line; and one first signal line, wherein:
the one control unit includes two switch branches, and the two switch branches include one main switch branch and one auxiliary switch branch; and
in the one multiplexer, a control terminal of each switch branch is electrically connected to one corresponding control line respectively,
wherein:
in one scanning period, the n-th control line provides an n-th clock signal and the first signal line provides a first signal, wherein n is a positive integer and n≤2M;
one clock period of each clock signal includes M consecutive time stages; and
in the one clock period, in the m-th control unit, the control line connected to the main switch branch only provides the effective voltage level in the m-th time stage, and the control line connected to the auxiliary switch branch provides an ineffective voltage level in the m-th time stage, wherein m is a positive integer and m≤M.

7. A display device comprising the display panel according to claim 6.

8. The display panel according to claim 6, wherein:
M=2;
the multiplexer includes two control units;
the one control unit includes two switch branches;
in a first control unit, a control terminal of a first switch branch is electrically connected to the first control line; an input terminal of the first switch branch is electrically connected to the output terminal of the corresponding shift register; a control terminal of a second switch branch is electrically connected to the second control line; an input terminal of the second switch branch is electrically connected to the first signal line; output terminals of the first and the second two switch branches are electrically connected to one same scan line; and in a second control unit, a control terminal of a first switch branch is electrically connected to the third control line; an input terminal of the first switch branch is electrically connected to the output terminal of the corresponding shift register; a control terminal of a second switch branch is electrically connected to the fourth control line; an input terminal of the second switch branch is electrically connected to the first signal line; output terminals of the first and the second switch branches are electrically connected to one same scan line.

9. The display panel according to claim 8, wherein:
the multiplexer includes a first transistor, a second transistor, a third transistor, and a fourth transistor;
in the first transistor, a gate electrode is electrically connected to the first control line and a first electrode is electrically connected to the output terminal of the corresponding shift register;
in the second transistor, a gate electrode is electrically connected to the second control line and a first electrode is electrically connected to the first signal line;
in the third transistor, a gate electrode is electrically connected to the third control line and a first electrode is electrically connected to the output terminal of the corresponding shift register;
in the fourth transistor, a gate electrode is electrically connected to the fourth control line and a first electrode is electrically connected to the first signal line;
a second electrode of the first transistor and a second electrode of the second transistor are electrically connected to a same scan line; and
a second electrode of the third transistor and a second electrode of the fourth transistor are electrically connected to a same scan line.

10. The display panel according to claim 6, wherein:
M=3;
the multiplexer includes three control units;
in a first control unit, a control terminal of a first switch branch is electrically connected to the first control line; an input terminal of the first switch branch is electrically connected to the output terminal of the corresponding shift register; a control terminal of a second switch branch is electrically connected to the second control line; an input terminal of the second switch branch is electrically connected to the first signal line; output terminals of the first and the second switch branches are electrically connected to one same scan line;
in a second control unit, a control terminal of a first switch branch is electrically connected to the third control line; an input terminal of the first switch branch is electrically connected to the output terminal of the corresponding shift register; a control terminal of a second switch branch is electrically connected to the fourth control line; an input terminal of the second switch branch is electrically connected to the first signal line; output terminals of the first and the second switch branches are electrically connected to one same scan line; and
in a third control unit, a control terminal of a first switch branch is electrically connected to the fifth control line; an input terminal of the first switch branch is electrically connected to the output terminal of the corresponding shift register; a control terminal of a second switch branch is electrically connected to the sixth control line; an input terminal of the second switch branch is electrically connected to the first signal line; output terminals of the first and the second both switch branches are electrically connected to one same scan line.

11. The display panel according to claim 10, wherein:
the multiplexer includes a first transistor, a second transistor, a third transistor, a fourth transistor, a fifth transistor, and a sixth transistor;
in the first transistor, a gate electrode is electrically connected to the first control line and a first electrode is electrically connected to the output terminal of the corresponding shift register;
in the second transistor, a gate electrode is electrically connected to the second control line and a first electrode is electrically connected to the first signal line;
in the third transistor, a gate electrode is electrically connected to the third control line and a first electrode is electrically connected to the output terminal of the corresponding shift register;
in the fourth transistor, a gate electrode is electrically connected to the fourth control line and a first electrode is electrically connected to the first signal line;
in the fifth transistor, a gate electrode is electrically connected to the fifth control line and a first electrode is electrically connected to the output terminal of the corresponding shift register;
in the sixth transistor, a gate electrode is electrically connected to the sixth control line and a first electrode is electrically connected to the first signal line;
a second electrode of the first transistor and a second electrode of the second transistor are electrically connected to a same scan line;
a second electrode of the third transistor and a second electrode of the fourth transistor are electrically connected to a same scan line; and
a second electrode of the fifth transistor and a second electrode of the sixth transistor are electrically connected to a same scan line.

* * * * *